(12) United States Patent
Chen et al.

(10) Patent No.: US 7,633,807 B2
(45) Date of Patent: Dec. 15, 2009

(54) BEHAVIOR BASED PROGRAMMING OF NON-VOLATILE MEMORY

(75) Inventors: Jian Chen, San Jose, CA (US); Jeffrey W. Lutze, San Jose, CA (US); Yan Li, Milpitas, CA (US); Daniel C. Guterman, Fremont, CA (US); Tomoharu Tanaka, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 88 days.

(21) Appl. No.: 11/624,052

(22) Filed: Jan. 17, 2007

(65) Prior Publication Data
US 2007/0121383 A1    May 31, 2007

Related U.S. Application Data

(63) Continuation of application No. 10/689,333, filed on Oct. 20, 2003, now Pat. No. 7,177,199.

(51) Int. Cl.
*G11C 16/04* (2006.01)

(52) U.S. Cl. .............. 365/185.24; 365/185.28; 365/185.26; 365/185.14

(58) Field of Classification Search ........... 365/185.28, 365/185.24, 185.26, 185.14
See application file for complete search history.

(56) References Cited

U.S. PATENT DOCUMENTS

| | | | |
|---|---|---|---|
| 4,627,027 A | 12/1986 | Rai | |
| 5,550,772 A * | 8/1996 | Gill | 365/185.03 |
| 5,623,442 A | 4/1997 | Gotou | |
| 5,729,494 A | 3/1998 | Gotou | |
| 5,870,334 A | 2/1999 | Hemink | |
| 5,912,836 A | 6/1999 | Liu | |
| 5,943,260 A | 8/1999 | Hirakawa | |
| 5,949,714 A | 9/1999 | Hemink | |
| 5,969,990 A | 10/1999 | Arase | |
| 6,125,052 A | 9/2000 | Tanaka | |
| 6,172,917 B1 * | 1/2001 | Kataoka et al. | 365/189.05 |
| 6,195,287 B1 * | 2/2001 | Hirano | 365/185.18 |
| 6,222,762 B1 | 4/2001 | Guterman | |
| 6,301,151 B1 | 10/2001 | Engh | |
| 6,301,161 B1 | 10/2001 | Holzmann | |
| 6,327,189 B2 * | 12/2001 | Banks | 365/185.18 |

(Continued)

FOREIGN PATENT DOCUMENTS

EP    1225596    7/2002

(Continued)

OTHER PUBLICATIONS

Hosono, et al., A High Speed Failure Bit Counter for the Pseudo Pass Scheme (PPS) in Program Operation for Giga Bit NANA Flash, Toshiba Corporation, pp. 23-26 (undated).

(Continued)

*Primary Examiner*—Thong Q Le
(74) *Attorney, Agent, or Firm*—Vierra Magen Marcus & DeNiro LLP

(57) ABSTRACT

The process for programming a set of memory cells is improved by adapting the programming process based on behavior of the memory cells. For example, a set of program pulses is applied to the word line for a set of flash memory cells. A determination is made as to which memory cells are easier to program and which memory cells are harder to program. Bit line voltages (or other parameters) can be adjusted based on the determination of which memory cells are easier to program and which memory cells are harder to program. The programming process will then continue with the adjusted bit line voltages (or other parameters).

48 Claims, 14 Drawing Sheets

U.S. PATENT DOCUMENTS

| | | | |
|---|---|---|---|
| 6,424,566 B1 | 7/2002 | Parker | |
| 6,522,580 B2 | 2/2003 | Chen | |
| 6,525,964 B2 | 2/2003 | Tanaka | |
| 6,529,412 B1 | 3/2003 | Chen | |
| 6,584,017 B2 * | 6/2003 | Maayan et al. | 365/185.22 |
| 6,735,114 B1 | 5/2004 | Hamilton | |
| 6,924,663 B2 | 8/2005 | Masui | |
| 7,177,199 B2 | 2/2007 | Chen et al. | |
| 2002/0118574 A1 | 8/2002 | Gongwer | |
| 2002/0191444 A1 * | 12/2002 | Gregori et al. | 365/185.19 |
| 2003/0147278 A1 | 8/2003 | Tanaka | |

FOREIGN PATENT DOCUMENTS

| | | |
|---|---|---|
| EP | 1341185 | 9/2003 |
| JP | H09-326199 | 12/1997 |
| JP | 2000-113686 | 4/2000 |
| JP | 2003-196988 | 7/2003 |
| WO | 9828745 | 7/1998 |

OTHER PUBLICATIONS

Choi, et al., A Novel Booster Plate Technology in High Density NAND Flash Memories for voltage Scaling-down and Zero Program Disturbance, Digest of papers from the 1996 IEDM, p. 238.

Chinese Office Action, dated Sep. 5, 2008, Chinese Appl. 200480030734.9, filed Oct. 12, 2004.

International Search Report and Written Opinion of the International Searching Authority, dated May 4, 2006, PCT Appl. No. PCT/US2004/033984, filed Oct. 12, 2004.

European Office Action dated Sep. 26, 2006, European Patent Appl. No. 04795181.9, filed Oct. 12, 2004.

Response to European Office Action dated Feb. 23, 2007, European Patent Appl. No. 04795181.9, filed Oct. 12, 2004.

European Office Action dated Apr. 23, 2007, European Patent Appl. No. 04795181.9, filed Oct. 12, 2004.

Response to European Office Action dated Nov. 5, 2007, European Patent Appl. No. 04795181.9, filed Oct. 12, 2004.

Chinese Office Action dated Feb. 20, 2009 in Chinese Patent Appliation No. 200480030734.9.

Japanese Office Action dated Aug. 121, 2009, Japanese Patent Appl. 2004-76471.

English Abstract of Japanese Patent Publication No. JP2003-196988.

English Abstract of Japanese Patent Publication No. JP-H09-326199.

English Abstract of Japanese Patent Publication No. JP2000-113686.

* cited by examiner

Fig. 24

| | Erase | Program w/ DS2=0 | Program w/ DS2=1 | Program Inhibit | 10 read | 00 read | 01 read | 10-1st-step program verify | 10-2nd-step program verify | 00-1st-step program verify | 00-2nd-step program verify | 01 program verify |
|---|---|---|---|---|---|---|---|---|---|---|---|---|
| BLe | Floating | 0V | 0.6V | Vdd | H or L | H or L | H or L | H or L | H or L | H or L | H or L | H or L |
| BLo | Floating | Vdd | Vdd | Vdd | 0V | 0V | 0V | 0V | 0V | 0V | 0V | 0V |
| SGD | Floating | Vdd | Vdd | Vdd | 4.5V | 4.5V | 4.5V | 4.5V | 4.5V | 4.5V | 4.5V | 4.5V |
| WL3 | 0V | 10V | 10V | 10V | 4.5V | 4.5V | 4.5V | 4.5V | 4.5V | 4.5V | 4.5V | 4.5V |
| WL2 | 0V | Vpgm | Vpgm | Vpgm | 0V | 1V | 2V | 0.0V | 0.6V | 1.0V | 1.6V | 2.6V |
| WL1 | 0V | 0V | 0V | 0V | 4.5V | 4.5V | 4.5V | 4.5V | 4.5V | 4.5V | 4.5V | 4.5V |
| WL0 | 0V | 10V | 10V | 10V | 4.5V | 4.5V | 4.5V | 4.5V | 4.5V | 4.5V | 4.5V | 4.5V |
| SGS | Floating | 0V | 0V | 0V | 0V | 0V | 0V | 0V | 0V | 0V | 0V | 0V |
| C-source | Floating | 0V | 0V | 0V | 0V | 0V | 0V | 0V | 0V | 0V | 0V | 0V |
| C-p-well | 20V | 0V | 0V | 0V | 0V | 0V | 0V | 0V | 0V | 0V | 0V | 0V |

BEHAVIOR BASED PROGRAMMING OF NON-VOLATILE MEMORY

CROSS-REFERENCE TO RELATED APPLICATIONS

This is a continuation application of U.S. patent application Ser. No. 10/689,333, filed Oct. 20, 2003, issued as U.S. Pat. No. 7,177,199 on Feb. 13, 2007, incorporated herein by reference.

BACKGROUND OF THE INVENTION

1. Field of the Invention

The present invention relates generally to technology for programming memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typical EEPROMs and flash memories utilize a memory cell with a floating gate that is provided above and insulated from a channel region in a semiconductor substrate. The channel region is positioned in a p-well between source and drain regions. A control gate is provided over and insulated from the floating gate. The threshold voltage of the memory is controlled by the amount of charge that is retained on the floating gate. That is, the level of charge on the floating gate determines the minimum amount of voltage that must be applied to the control gate before the memory cell is turned on to permit conduction between its source and drain.

Some EEPROM and flash memory devices have a floating gate that is used to store two ranges of charges and, therefore, the memory cell can be programmed/erased between two states. When programming an EEPROM or flash memory device, a program voltage is applied to the control gate and the bit line is grounded. Electrons from the channel are injected into the floating gate. When electrons accumulate in the floating gate, the floating gate becomes negatively charged and the threshold voltage of the memory cell is raised.

Typically, the program voltage applied to the control gate is applied as a series of pulses. The magnitude of the pulses is increased with each successive pulse by a predetermined step size (e.g. 0.2 v). In the periods between the pulses, verify operations are carried out. That is, the programming level of each cell of a group of cells being programmed in parallel is read between each programming pulse to determine whether it is equal to or greater than a verify level to which it is being programmed. One means of verifying the programming is to test conduction at a specific compare point. The cells that are verified to be sufficiently programmed are locked out, for example, by raising the bit line voltage from 0 to Vdd (e.g., 2.5 volts) to stop the programming process for those cells. In some cases, the number of pulses will be limited (e.g. 20 pulses) and if a given memory cell is not completely programmed by the last pulse, then an error is assumed. In some implementations, memory cells are erased (in blocks or other units) prior to programming. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

FIG. 1 shows a program voltage signal Vpgm applied to the control gates of flash memory cells. The program voltage signal Vpgm includes a series of pulses that increase in magnitude over time. At the start of the program pulses, the bit lines (e.g. connected to the drain) of all cells that are to be programmed are grounded, thereby, creating a voltage difference of Vpgm–0 v from gate to channel. Once a cell reaches the targeted voltage (passing program verify), the respective bit line voltage is raised to Vdd so that the memory cell is in the program inhibit mode (e.g. program to that cell stops). Obviously, the faster programmed cells reach this condition earlier than the slower programmed cells. For example, FIG. 1 shows that the bit line voltage for a faster cell is raised to Vdd before the bit line voltage for a slower cell.

A multi-bit or multi-state flash memory cell is implemented by identifying multiple, distinct threshold voltage ranges within a device. Each distinct threshold voltage range corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

To achieve proper data storage for a multi-state cell, the multiple ranges of threshold voltage levels of the multi-state memory cell should be separated from each other by sufficient margin so that the level of the memory cell can be programmed or erased in an unambiguous manner. Additionally, a tight threshold voltage distribution is recommended. To achieve a tight threshold voltage distribution, small program steps typically have been used, thereby, programming the threshold voltage of the cells more slowly.

The natural threshold voltage distribution of a set of memory cells is the threshold voltage distribution obtained when the memory cells receive the same one or more pulses. FIG. 2 depicts the natural threshold voltage distribution W (natural $V_{TH}$). The natural threshold voltage distribution reflects the natural physical and electrical variations of the large number of memory cells. There are many factors that contribute to the variations, such as active layer (cell width) size, channel length, tunnel oxide thickness, tunnel oxide local thinning, the shape of the floating gate, the inter-polysilicon ONO thickness as well as the source drain overlap area, etc. It is a challenge to make ever physically smaller and ever larger number of such cells identical. As devices get smaller and more states are used in multi-state cells, the natural threshold distribution widens and the need for tighter threshold distribution increases. As the natural threshold voltage distribution widens, more program steps are needed to obtain the required tight threshold voltage distribution. As more program steps are used, more time is needed for programming. From a consumer point of view, that means that the digital camera or other device using this memory storage operates more slowly. Thus, there is a need to increase programming speeds.

SUMMARY OF THE INVENTION

The present invention, roughly described, pertains to technology for programming a memory device. The process for programming the memory device is improved by adapting the programming process based on behavior of that memory cell.

One embodiment of the present invention includes categorizing a set of non-volatile storage elements into three or more groups based on behavior of the non-volatile storage elements and programming the non-volatile storage elements using a different programming condition for each group.

Another embodiment of the present invention includes applying initial programming to non-volatile storage elements until at least one non-volatile storage element reaches a target threshold value. Programming is subsequently adjusted based on behavior for at least a subset of the non-volatile storage elements that have not reached the target threshold value.

An example implementation includes a set of non-volatile storage elements, a set of control lines in communication with the non-volatile storage elements and a controlling circuit in communication with the control lines. The controlling circuit causes the performance of the steps described above.

In one variation, the categorizing of non-volatile storage elements based on behavior includes applying one or more non-zero source voltages to the set of non-volatile storage elements. While applying the non-zero source voltages, threshold voltages of the set of non-volatile storage elements are characterized by applying one or more positive voltages to control gates for the non-volatile storage elements and determining whether the non-volatile storage elements turn-on in. Determining whether the non-volatile storage elements turn-on in provides an indication of whether the non-volatile storage elements have a threshold voltage greater than a negative voltage compare point.

In another variation, the categorizing of non-volatile storage elements based on behavior includes charging bit lines for the non-volatile storage elements, applying a control gate signal and allowing the bit lines to discharge. The subsequent programming of the non-volatile storage elements includes adjusting a subset of bit line voltages based on how the bit lines discharged.

These and other objects and advantages of the present invention will appear more clearly from the following description in which the preferred embodiment of the invention has been set forth in conjunction with the drawings.

BRIEF DESCRIPTION OF THE DRAWINGS

FIG. 24 depicts examples of values for various embodiments associated with FIGS. 21-23.

DETAILED DESCRIPTION

Figure 3:
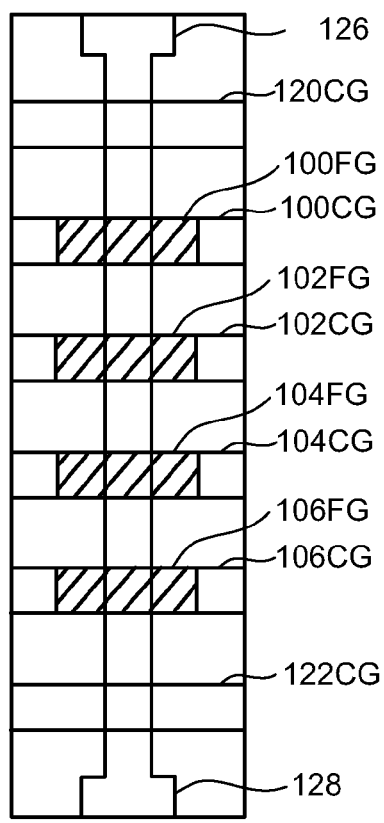
FIG. 3 is a top view of a NAND string.
Figure 4:
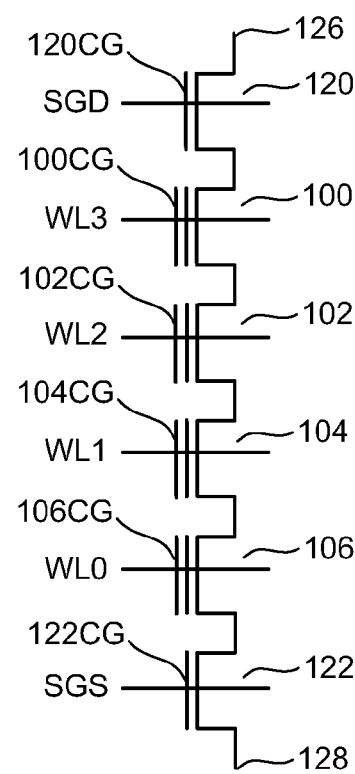
FIG. 4 is an equivalent circuit diagram of the NAND string.

One example of a flash memory system suitable for implementing the present invention uses the NAND structure, which includes arranging multiple transistors in series between two select gates. The transistors in series and the select gates are referred to as a NAND string. FIG. 3 is a top view showing one NAND string. FIG. 4 is an equivalent circuit thereof. The NAND string depicted in FIGS. 3 and 4 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0.

Figure 5:
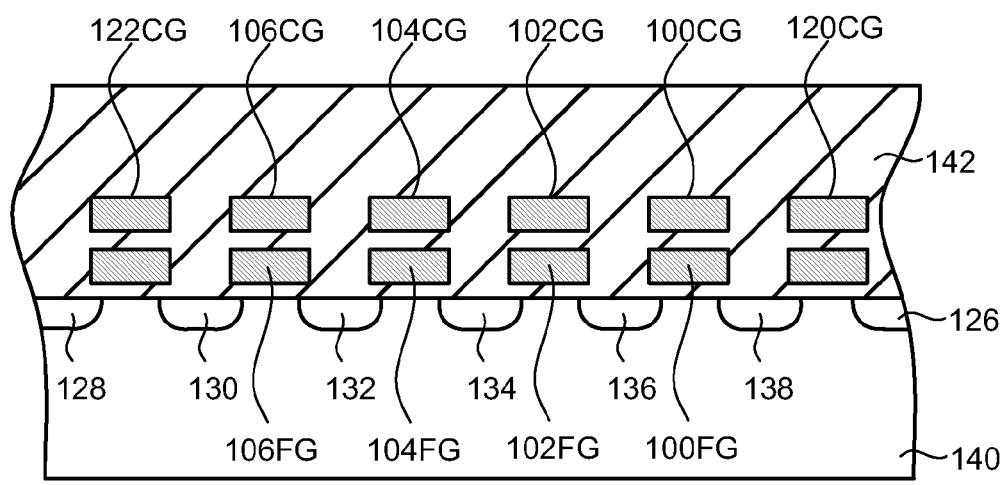
FIG. 5 is a cross sectional view of the NAND string.

FIG. 5 provides a cross-sectional view of the NAND string described above. As depicted in FIG. 5, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an inter-polysilicon dielectric layer separating the control gate and floating gate. Note that FIG. 5 appears to depict a control gate and floating gate for transistors 120 and 122. However, for transistors 120 and 122, the control gate and the floating gate are connected together. The control gates of the memory cells (100, 102, 104, 106) form the word lines. N+ diffused layers 130, 132, 134, 136 and 138 are shared between neighboring cells, whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 3-5 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, for example, thereby storing multiple bits of digital data. In the case of storing multiple levels of data, the range of possible threshold voltages is divided into the number of storage levels. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference in their entirety: U.S. Pat. Nos. 5,570,315; 5,774,397; 6,046,935; 5,386,422; 6,456,528 and U.S. patent application. Ser. No. 09/893,277 (Publication No. US2003/0002348). Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

Figure 6:
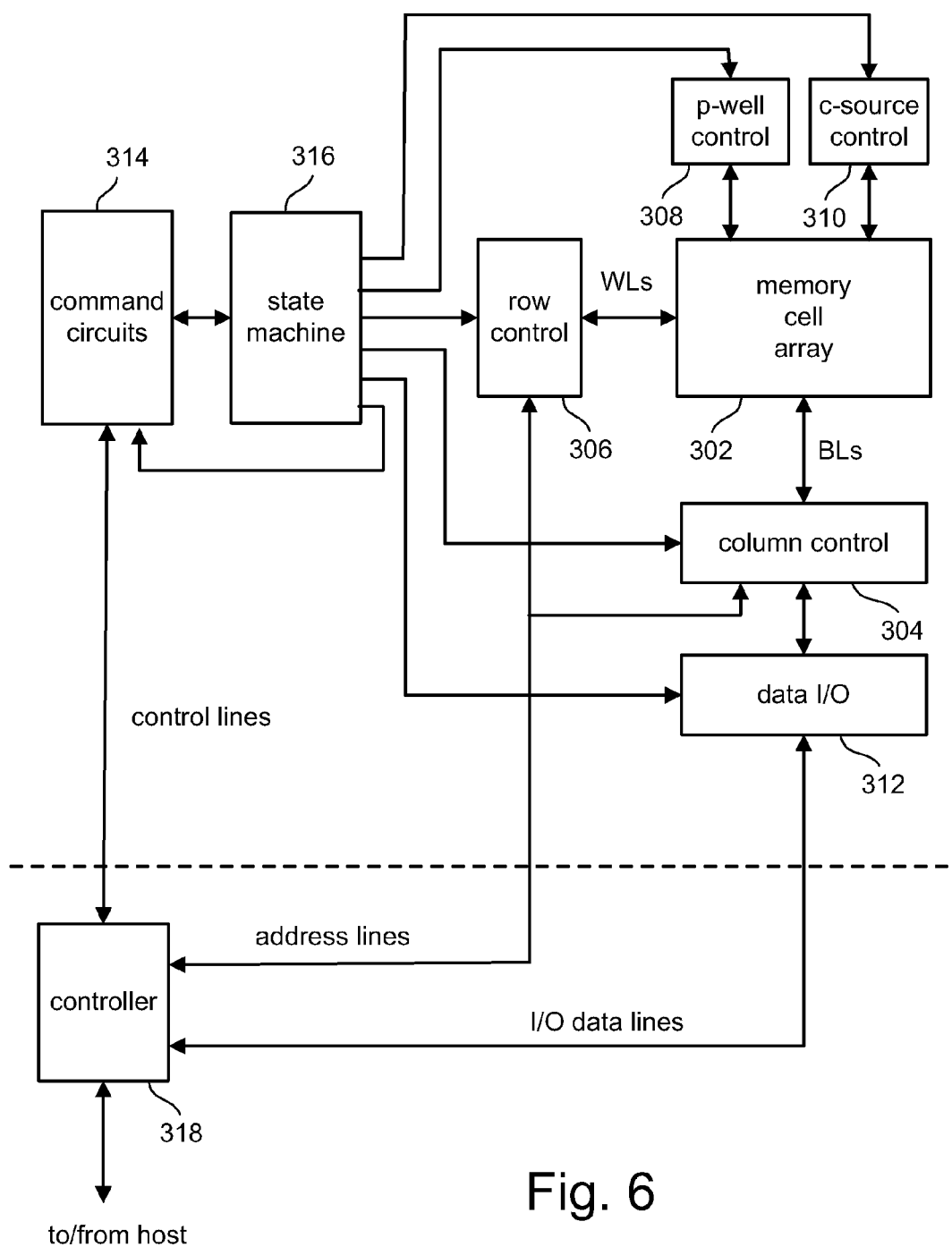
FIG. 6 is a block diagram of one embodiment of a non-volatile memory system in which the various aspects of the present invention are implemented.

FIG. 6 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 7) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller can be embedded in the host or included within a removable memory system.

Figure 7:
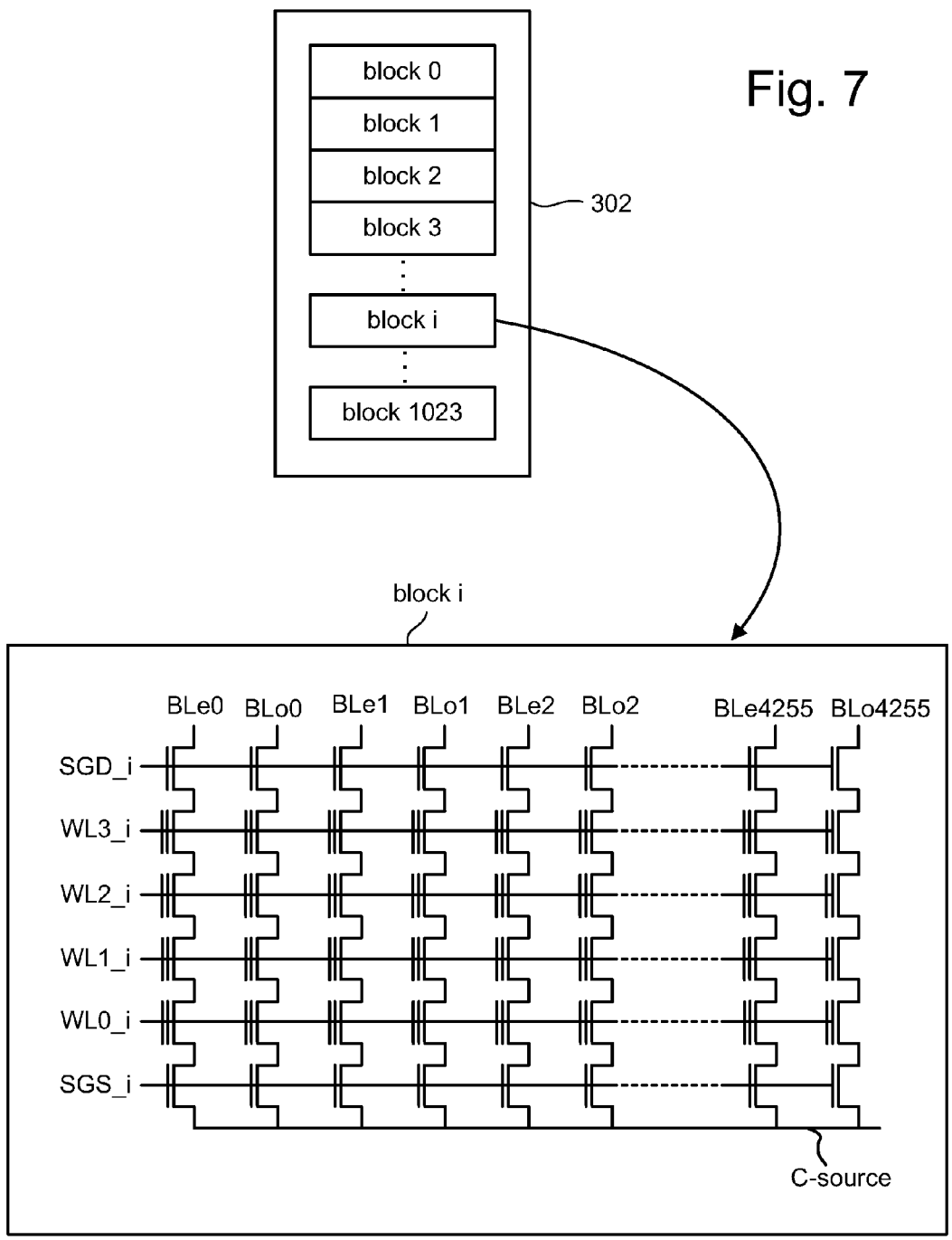
FIG. 7 illustrates an example of an organization of a memory array.

With reference to FIG. 7, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 7 shows four memory cells connected in series to form a NAND string. Although four cells are shown to be included in each NAND string, more or less than four memory cells can be used. One terminal of the NAND string is connected to corresponding bit line via a first select transistor SGD, and another terminal is connected to c-source via a second select transistor SGS.

During read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 logical pages. Other sized blocks and pages can also be used with the present invention. Additionally, architectures other than that of FIGS. 6 and 7 can also be used to implement the present invention.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0 V. In a verify operation for a two level memory cell, the selected word line WL2 is connected to 2.4 V, for example, so that it is verified whether the threshold voltage has reached at least 2.4 V. The source and p-well are at zero volts. The selected bit lines (BLe) are pre-charged to a level of, for example, 0.7 V. If the threshold voltage is higher than the read or verify level on the word line, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5 V, because of the conductive memory cell (M). The state of the memory cell is, thereby, detected by a sense amplifier that is connected to the bit line.

The erase, read and verify operations described above are performed according to techniques known in the art. Thus, many of the details explained can be varied by one skilled in the art.

Figure 8:
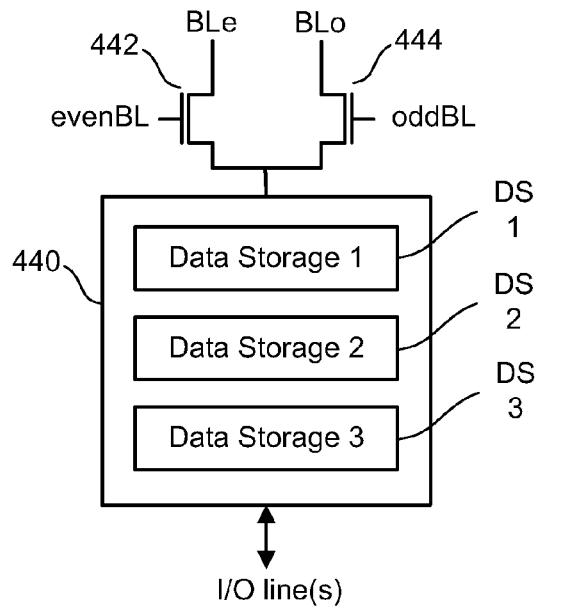
FIG. 8 depicts a portion of the column control circuit.

FIG. 8 is a schematic block diagram of a portion of column control circuit 304 of FIG. 6. In column control circuit 304, a data storage circuit 440 is arranged for every two bit lines, including an even numbered BLe and an odd numbered bit line BLo. In the column control circuit 304, a sense amplifier is also arranged for data storage circuit 440 in order to write data into and read data from memory cells.

Referring to FIG. 8, an n-channel MOS transistor 442 is connected for column selection between data storage circuit 440 and even numbered bit line BLe. Another n-channel MOS transistor 444 is connected for column selection between data storage circuit 440 and odd numbered bit line BLo.

Either of the even numbered bit line BLe or the odd numbered bit line BLo is selected to control the operation of writing data or reading data. More specifically, when signal evenBL is at logic level 1 and the signal oddBL is at logic level 0, and MOS transistor 442 is made electrically conductive to select the even numbered bit line BLe, which is then connected to the data storage circuit 440. When, on the other hand, the signal evenBL is at logic level 0 and oddBL is at logic level 1, transistor 444 is made electrically conductive to select the odd numbered bit line BLo, which is then connected to the data storage circuit 440. Note that the signal evenBL is applied to all of the n-channel MOS transistors for column selection connected through the even numbered bit lines; whereas the signal oddBL is applied to all the n-channel MOS transistors for column selection connected to the odd numbered bit lines.

Each data storage circuit 440 includes three binary data storage sections DS1, DS2 and DS3. Storage section DS1 is connected to the data input/output 312 by way of the internal data input/outlines line(s) and stores an externally input data to be written or a readout data to be externally output. Data storage section DS2 stores the detection outcome of a write verify operation for confirming the threshold value of a memory cell after a write operation. Data storage section DS3 temporarily stores the data of a memory cell at the time of writing it and/or at the time of reading it. In other embodiments, the data storage sections can also have other functions. In various embodiments, DS1, DS2, DS3 can be portions of a memory unit, one or more registers, or any other device that can store information. In one embodiment, DS1, DS2 and DS3 are each one bit. In other embodiments, one or more of DS1, DS2 and DS3 can store multiple bits.

Note that the FIG. 8 shoes and even/odd bit line configuration. However, the present invention can be used with many different bit line configurations, such as a configuration where each bit line has its own sense amplifier and/or data storage. In some configurations suitable for implementing the present invention, all bit lines are programmed in one pass, rather than in odd and even passes. For example, see U.S. patent application Ser. No. 10/254,483, "Highly Compact Non-Volatile Memory and Method Thereof," filed on Sep. 24, 2002, incorporated herein by reference in its entirety.

Figure 9:
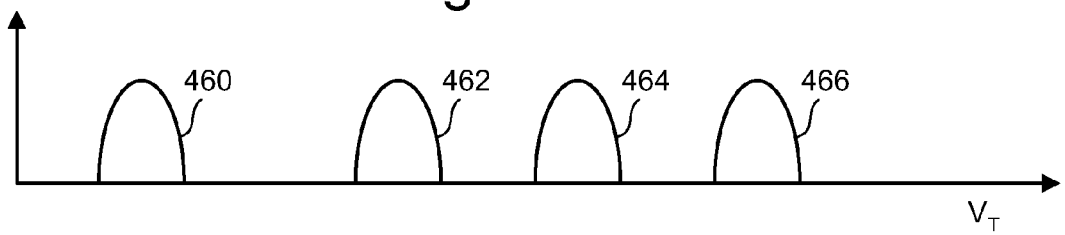
FIG. 9 depicts memory cell threshold distributions for multi-state memory cells.

FIG. 9 illustrates threshold voltage distributions for memory cells storing two bits of data (e.g., four data states). In one embodiment, distribution 460 represents a distribution of threshold voltages of cells that are in the erased state (e.g., storing "11"), having negative threshold voltage levels. Distribution 462 represents a distribution of threshold voltages of cells that are storing "10." Distribution 464 represents a distribution of threshold voltages of memory cells storing "00." Distribution 466 represents a distribution of threshold voltages of cells that are storing "01." In other embodiments, each of the distributions can correspond to different data states than described above. Additionally, the present invention can work with memory cells that store more than two bits.

In one implementation, a memory cell in the erased state (distribution 460) can be programmed to any of the program states (distributions 462, 464 or 466). In another embodiment, memory cells in the erased state are programmed according to a two-step methodology. In this two-step methodology, each of the bits stored in a data state correspond to different logical pages. That is, each bit stored in a memory cell has a different logical page address, pertaining to a lower logical page and an upper logical page. For example, in state "10," the "1" is stored for the lower logical page and the "0" is stored for the upper logical page. In a first programming step, the cell's threshold voltage level is set according to the bit to be programmed into the lower logical page. If that bit is a logic "1," the threshold voltage is not changed since it is in the appropriate state as a result of having been earlier erased. However, if the bit is to be programmed to a logic "0," the threshold level of the cell is increased to be within the threshold voltage distribution 462. In the second programming step, the cell's threshold voltage level is set according to the bit being programmed into the upper logical page. If the upper logical page bit is to be logic "1," then no further programming occurs since the cell is in one of the states corresponding to the threshold voltage distribution 460 or 462, both of which carry an upper page bit of "1." If the upper logical page bit is to be logic "0" and the first step resulted in the cell remaining in the erased state corresponding to threshold 460, then the second step of the programming process includes raising the threshold voltage to be within threshold distribution 466. If the upper logical page bit is to be logic "0" and the cell had been programmed into the state corresponding to threshold distribution 462 as a result of the first programming step, then the second step of the programming process includes raising the threshold voltage to be within threshold voltage distribution 464. The two step process is just one example of a methodology for programming multi-state memory. Many other methodologies, including a one step process or more than two steps can be used. Although FIG. 8 shows four states (two bits), the present invention can also be used other multi-state structures including those that include eight states, sixteen states, thirty-two states, and others.

Figure 10:
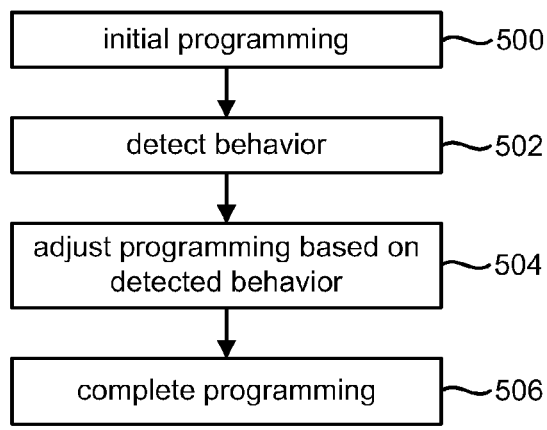
FIG. 10 is a flow chart describing one embodiment of a process for adapting a programming operation based on behavior of one or more memory cells.

FIG. 10 is a flow chart describing one embodiment of a progress for adapting the programming process based on behavior of one or more memory cells. In one embodiment, the behavior used to adapt the programming process pertains to programmability, for example, how fast or slow a memory cell can be programmed, how hard or easy a memory cell can be programmed, or other aspects of programmability. Additionally, other behavioral aspects can also be used.

In step 500, initial programming is performed. For example, if programming pulses are used, as described above, then one or a small number of programming pulses are applied to the word line (e.g., control gate). In step 502, behavior of the various memory cells being programmed is detected. Many different types of behavioral data can be inquired into. In step 504, the programming process is adjusted based on the detected behavior of the memory cells. In step 506, the memory process is completed using the adjustments described with respect to step 504.

The present invention can use various types of behavior data to adjust the programming. One example of behavioral data that can be used is the speed in which the memory cell can adjust its threshold voltage (speed of programming). In other embodiments, other behavioral data can also be used. If it is known which cells program fast and which cells program slow, then different bit line voltages can be applied to the fast and slow cells during the programming process. Thus, in one embodiment, the fast and slow programming cells can be brought to program at a somewhat similar speed. This can effectively cut the natural threshold voltage distribution by about one-half. If the memory cells are divided in more groups than two, for example, degrees of slow and fast, then the threshold voltage distribution can be made even narrower.

Figure 11:
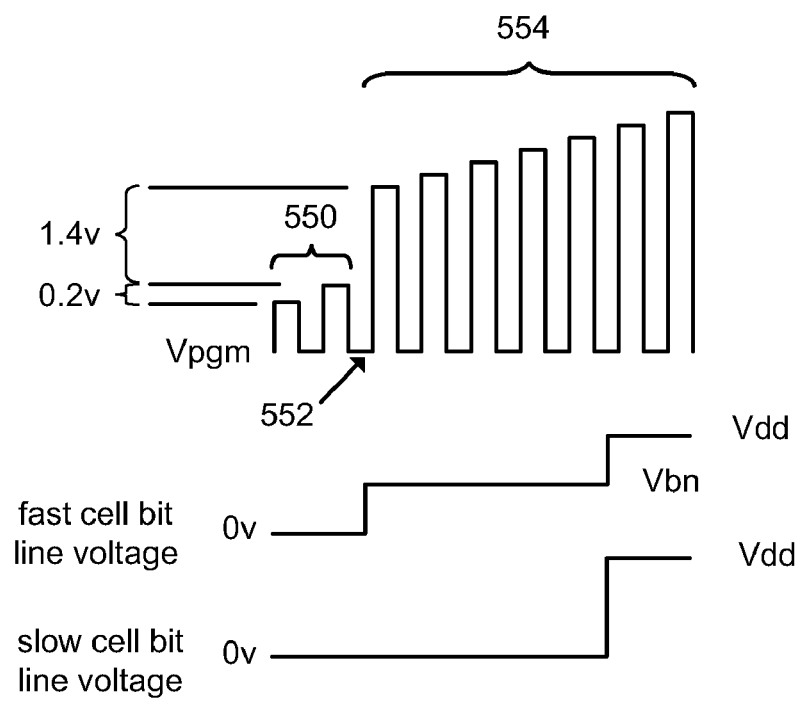
FIG. 11 depicts signals on a word line and bit lines during an exemplar programming process.

One example implementation is depicted with respect to FIG. 11. Initially a set of one or more programming pulses 550 are applied to the word line. FIG. 10 shows two initial pulses; however, one or more than two pulses can also be used. After the initial pulses, a memory cell speed detection process is carried out at time 552, as described below. The system determines which memory cells are fast and which memory cells are slow. For memory cells that are slow, the bit line voltage is maintained at zero volts. For the memory cells that are programming fast, the bit line voltage is raised to an intermediate level, labeled as Vbn. An example of Vbn is 1.2 volts. An example of Vdd, the programming inhibit voltage, is 2.6 volts. Raising the bit line voltage during the programming process has the effect of slowing down the programming process. That is, because the voltage differential between the control gate and the drain is made smaller, the programming process is slowed down.

After conditionally adjusting the bit line, instead of stepping up Vpgm by 0.2 v higher, a higher step is used for the immediately following programming pulse. One example of a higher step of voltage is 1.4 volts. In another embodiment, the step up voltage is made equal to the width of the natural threshold distribution divided by two. FIG. 11 shows pulses 554. The first pulse of pulses 554 is increased from the last pulse in pulses 550 by this larger step up voltage of, e.g., 1.4 volts. Subsequent pulses are stepped by 0.2 v or another suitable amount. Note that following time 552, which is between pulses 550 and 554, the bit lines for the fast cells are raised from 0 volts to Vbn during subsequent programming pulses 554. Since Vbn is applied to the bit line, the channel voltage during programming is approximately Vbn, so it slows down the program process to compensate for the big jump in Vpgm, allowing the fast group of memory cells to finish programming at about the same time as would be the case for the standard method when zero volts is applied to the bit lines and the Vpgm step is 0.2 v. However, due to the jump of Vpgm, the slow memory cells will program faster than the standard method and finish at about the same time as the fast group. Thus, FIG. 11 shows both the fast and slow cells completing the program process and being brought to inhibit at relatively the same time, as depicted by the raising of the bit lines to Vdd. Because larger program pulses are used, less pulses are needed to program the slower memory cells. Because less programming pulses are used, a faster overall program speed is achieved.

Correlating FIG. 11 to FIG. 10, the initial programming of step 500 is depicted by pulses 550 in FIG. 11. The detection of behavior in step 502 is performed during time period 552 of FIG. 11. The adjusting of the programming is depicted in FIG. 11 by the raising of the fast cells' bit line voltages from 0 volts to Vbn. The completion of programming in step 506 is depicted by pulses 554 in FIG. 11.

Figure 11A:
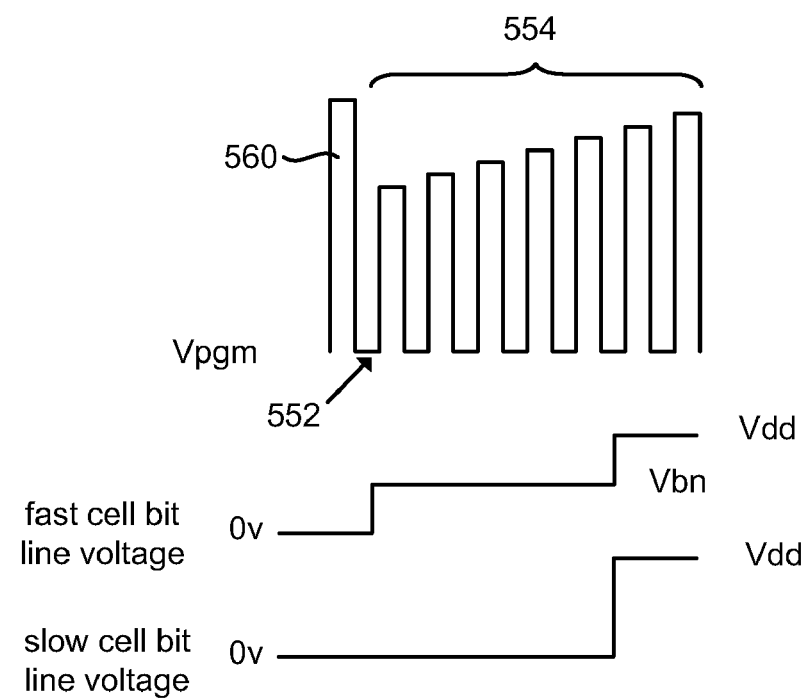
FIG. 11A depicts signals on a word line and bit lines during a second exemplar programming process.

FIG. 11A provides a second example of a programming process. In this second example, the initial program pulse(s) 560 has a higher magnitude voltage than in FIG. 11. Other embodiments can use larger or smaller initial pulses. The point is to provide enough programming to be able to distinguish fast cells from slow cells, or distinguish other behavior.

Figure 12:
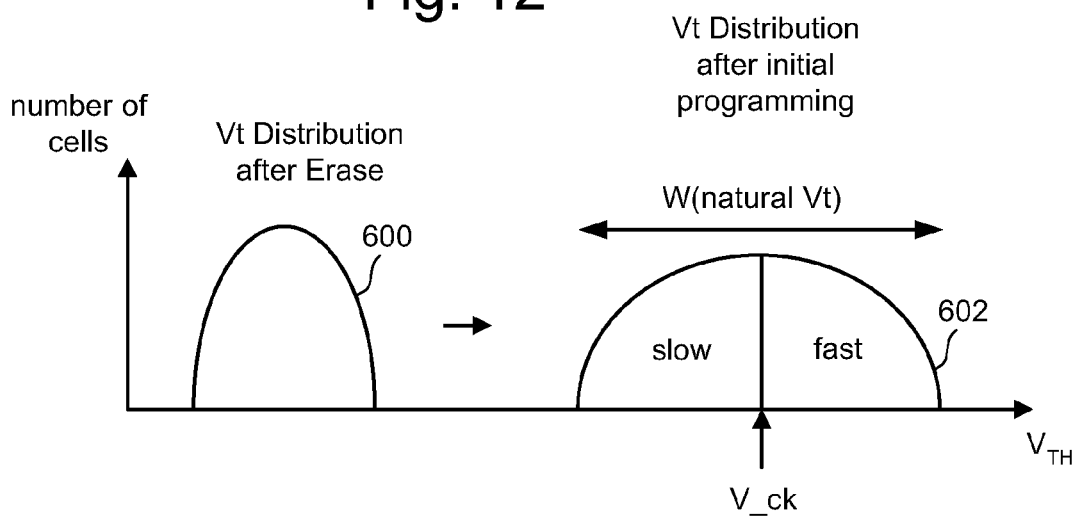
FIG. 12 depicts examples of voltage distributions after erase and after one or more program pulses.
Figure 13:
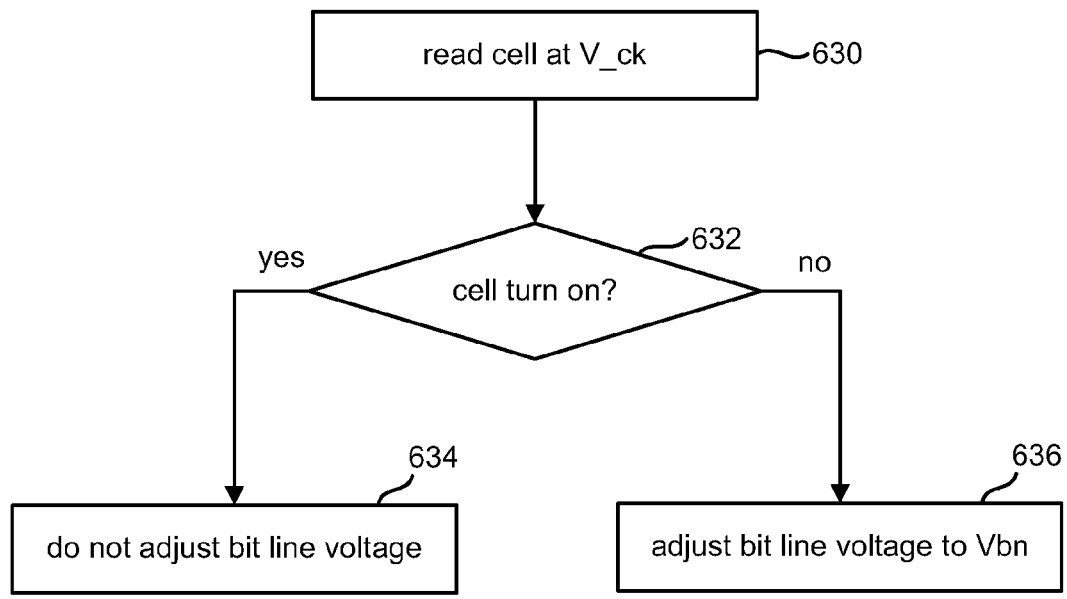
FIG. 13 is a flow chart describing one embodiment of a process for detecting behavior of one or more memory cells and adjusting programming based on the detected behavior.

FIGS. 12-24 provide more detail for various embodiments for detecting behavior and adjusting programming based on that detected behavior. For example, FIGS. 12 and 13 provide more details for an embodiment which detects whether memory cells are in the fast group or slow group. FIG. 12 depicts voltage distribution 600 after erase and voltage distribution 602 after a first set of one or more programming pulses. This distribution can be divided in half. For example, voltage V_ck divides the distribution in half. In some embodiments, the dividing point does not necessarily have to be the exact halfway point. Memory cells that have a threshold voltage that is within distribution 602 and is less than V_ck, are considered to be slow memory cells. Memory cells that have a threshold voltage that is within distribution 602 and is greater than or equal to V_ck, are considered to be fast memory cells. Those memory cells that are determined to be fast memory cells have their bit line raised, as described above.

V_ck can be determined by device characterization, simulation or experimentation. Other means for determining V_ck can also be used. Device characterization can also be used to determine how many pulses 550 to use in order for the faster programming cells to have a threshold voltage greater than V_ck and slower programming cells to have a threshold voltage lower than V_ck. In one embodiment, the fastest programming cells can be detected crossing V_ck and, assuming a well behaved distribution, an estimate can be made for how many additional pulses are needed such that the faster programming cells have a threshold voltage greater than V_ck and slower programming cells have a threshold voltage less than V_ck. Other means known to those skilled in the art can also be used to determine how many pulses 550 to apply.

FIG. 13 is the flow chart describing one embodiment of a process for detecting whether the memory cell is fast or slow and adjusting the bit line accordingly. In step 630, the memory cell is read by applying V_ck at the control gate. If the memory cell turns on (step 632), then the threshold voltage for the memory cell is less than V_ck and the memory cell is a slow cell. In that case, in step 634, the bit line voltage will not be adjusted because of the behavior. If the memory cell did not turn on in step 630, then the threshold voltage of that cell is above V_ck and that memory cell is a fast cell. For fast memory cells, the bit line is adjusted to be Vbn in step 636.

Figure 14:
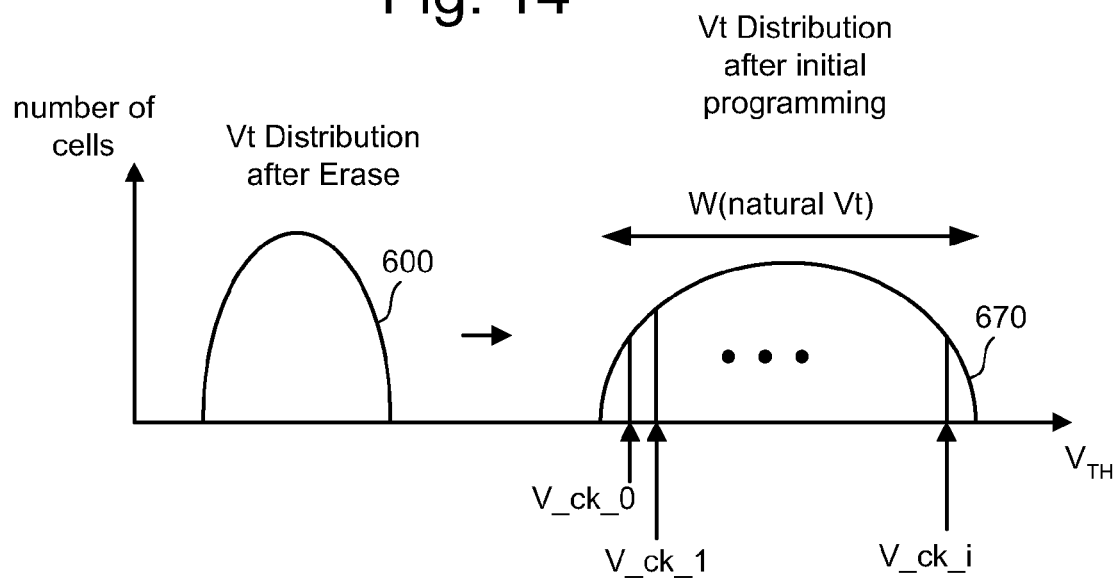
FIG. 14 depicts examples of voltage distributions after erase and after one or more program pulses.
Figure 15:
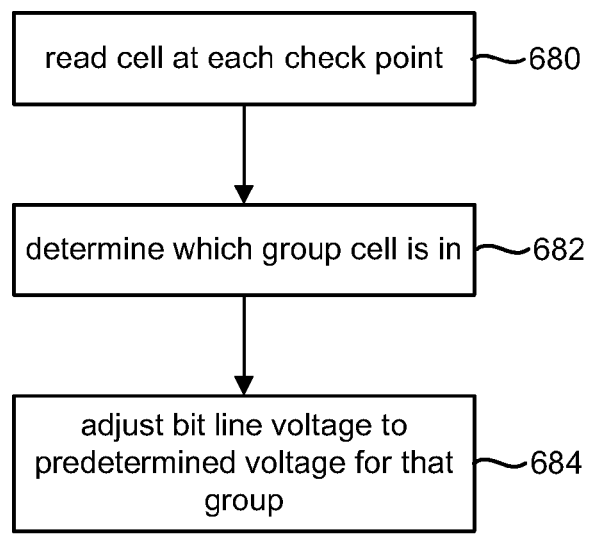
FIG. 15 is a flow chart describing one embodiment of a process for detecting behavior of one or more memory cells and adjusting programming based on the detected behavior.

Note the embodiment of FIGS. 12 and 13 determines whether a memory cell is fast or slow, thereby, categorizing the memory cells into one of two groups. One of those groups is fast memory cells and the other group is slow memory cells. In other embodiments, the memory cell can be categorized into more than two groups. For example, FIG. 14 depicts threshold voltage distribution 600 of the memory cells after erase. FIG. 14 also shows natural threshold distribution 670 after one or more initial program pulses. Threshold distribution 670 is divided into i groups. For example, the first group includes those memory cells having a threshold voltage that is less than V_ck_0, the second group includes those memory cells having a threshold voltage which is greater than V_ck_0 and less than V_ck_1, etc. FIG. 15 is a flow chart describing a process for detecting behavior, including characterizing which group a particular memory cells belongs to and then adjusting the bit lines according to the particular group. In step 680, the memory cell is read at each check point (e.g. V_ck_0, V_ck_1, ... V_ck_i). Based on when the cell turns on and when it does not turn on, a determination is made as to which group a particular memory cell belongs to in step 682. Note that instead of a voltage sensing verifying scheme, the process can also use a current sensing scheme or other means for reading/verifying the state of a memory cell. In step 684, the bit line for the particular memory cell is adjusted based on which group it is categorized to be in. That is, in one embodiment, each group will correspond to a different bit line voltage adjustment. For example, a first group will have a first bit line voltage, a second group will have a second bit line voltage, etc. After determining which group a memory cell belongs to, that memory cell will then have its bit line voltage made equal to the bit line voltage for that group. In one embodiment, the lowest group (threshold voltages less than V_ck_0) will have a bit line voltage of zero, the second group (threshold voltages greater than V_ck_0 and less than V_ck_1) will have a bit line voltage of W/i, the third group will have a bit line voltage of 2W/i, the fourth group will have a bit line voltage of 3W/i, etc. W is the width of the natural threshold voltage distribution.

The finer the distribution is chopped, the more groups and the tighter the final threshold voltage distribution. However, if more groups are used, then more time will be needed to do the read operations. Furthermore, the system will need more buffers to store the relevant speed and group information.

Figure 16:
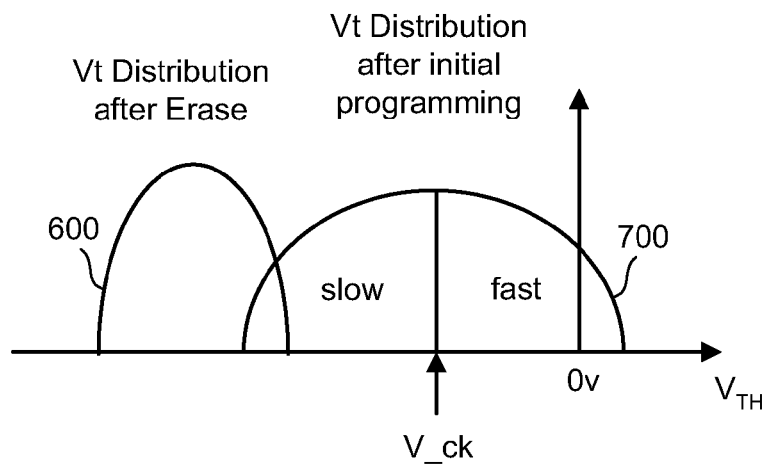
FIG. 16 depicts examples of voltage distributions after erase and after one or more program pulses.

In some embodiments, after the first one or more initial pulses it is possible that much of the natural threshold voltage distribution is below zero volts. That is, many of the memory cells will have a threshold voltage less than zero volts. In such a circumstance, it may be difficult to determine which threshold voltages are slow and which are fast because the checkpoint may be below zero volts. That is, it may be difficult to apply negative voltage to the control gate of memory cells to determine which memory cells are below and above V_ck if V_ck is less than zero. For example, FIG. 16 shows threshold voltage distribution 600 after an erase operation and threshold voltage distribution 700 after initial programming. Note that much of distribution 700 is below zero and V_ck is below zero.

Figure 17:
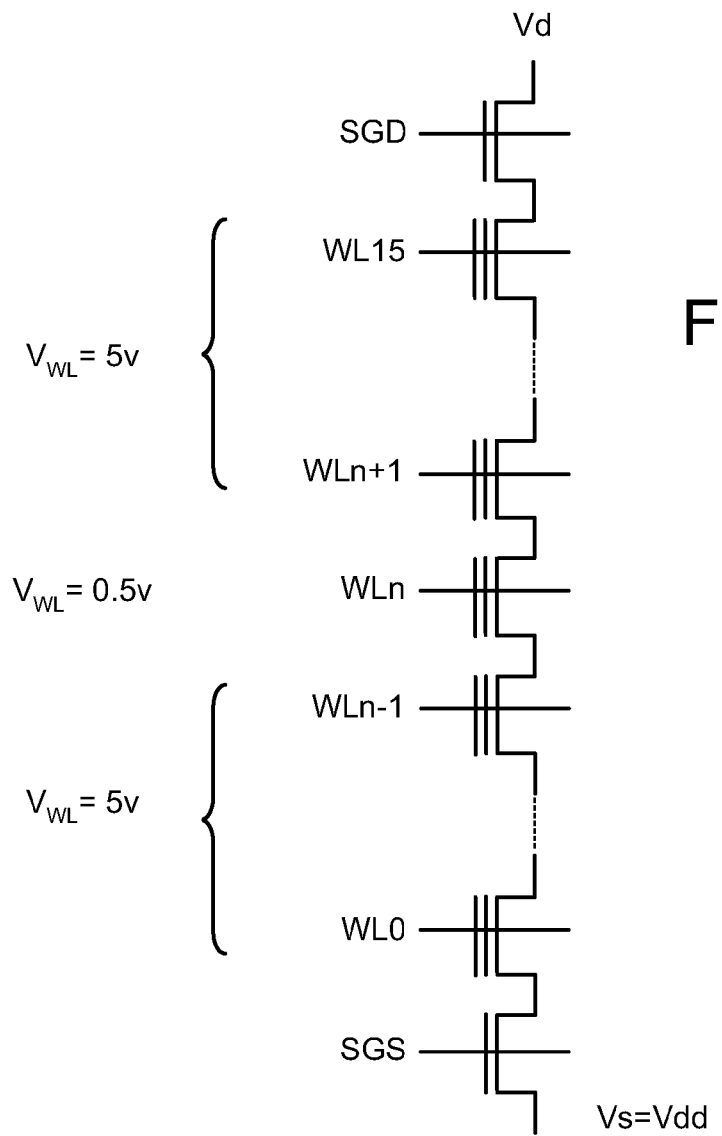
FIG. 17 depicts a NAND string.

Another embodiment for detecting behavior and adjusting programming solves the problem associated with having the threshold voltages below zero by using the body effect. The body effect includes a shift of the threshold voltage in a positive direction because there is a bias between the source of the transistor and the body (substrate) of the transistor. Thus, by applying a voltage to the source, the threshold voltage can be raised. The larger the voltage to the source, the larger the apparent shift in threshold voltage. Thus, detecting negative threshold voltage can be accomplished by applying a voltage to the source to effectively raise the threshold voltage to a level above zero and then applying a positive voltage to the word line. For example, FIG. 17 shows a NAND string having sixteen memory cells connected to each of sixteen word lines (WL0 . . . WL15). The word line being programmed WLn will receive a voltage of 0.5 volts, while the other word lines will receive 5 volts. The source line, which is normally at zero volts, receives a voltage equal to Vdd (e.g., 2.6 volts). Other source line voltages can also be used. The idea is that the application of the voltage at the source line will raise the apparent threshold voltage of the memory cell so that testing at 0.5 volts will determine whether the memory cell is below or above V_ck (e.g., slow or fast). That is, a memory cell whose threshold voltage is at V_ck of FIG. 16 will have its effective threshold voltage raised to 0.5 volts due to the voltage applied at the source. Memory cells that are raised to a level greater than or equal to 0.5 volts will be considered fast and others that are below 0.5 volts will be considered slow.

Figure 18:
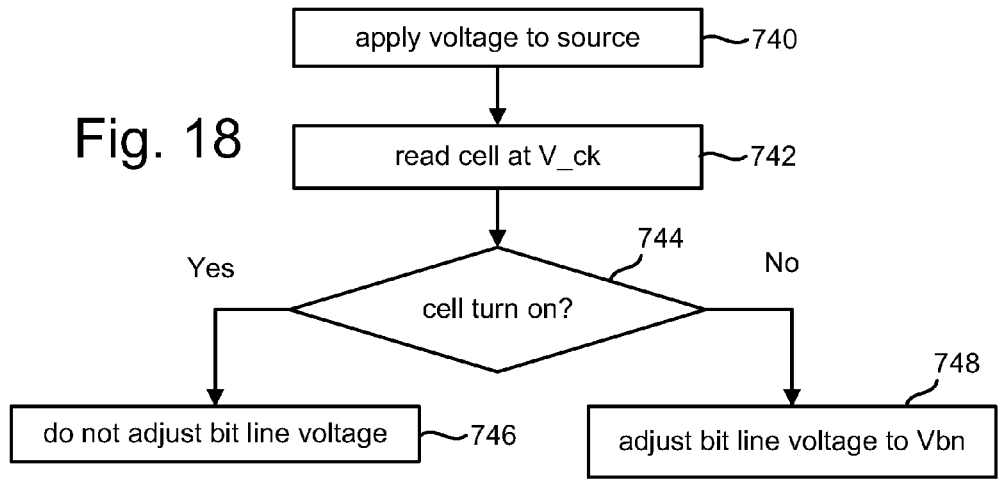
FIG. 18 is a flow chart describing one embodiment of a process for detecting behavior of one or more memory cells and adjusting programming based on the detected behavior.

FIG. 18 depicts a flow chart describing one embodiment of a process for utilizing the body effect to determine behavior. In step 740, a voltage is applied to the source, for example, Vdd is applied as described above. In some embodiments, all of the memory cells may receive the same or similar source voltage. In other embodiments, the source voltage may vary. In step 742, the particular cell of interest is read by applying a test voltage at the word line. FIG. 17 shows 0.5 volts applied. If the cell turns on, then the memory cell is considered a slow cell and the bit line is not adjusted in step 746. If the cell does not turn on (step 744), then it is considered a fast memory cell and the bit line is adjusted to Vbn in step 748. Note that the process of FIG. 18 can be adapted to categorize the memory cells into multiple groups using the technology described with respect to FIGS. 14 and 15. Note that the word line voltage of 0.5 volts for reading the memory cell being programmed is chosen based on device characterization and in some cases can be a function of channel doping. Other values can also be used.

This concept of utilizing the body effect to determine behavior can be applied in conjunction with other embodiments disclosed herein. For example, in the embodiment that categorizes the memory cells into multiple groups, the categorization can be based utilizing the body effect to determine behavior.

Figure 19:
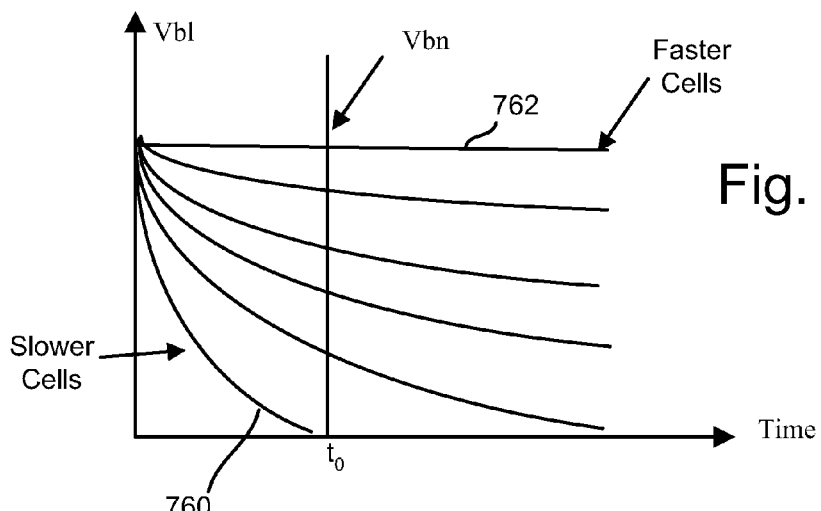
FIG. 19 is a graph illustrating bit line voltage (Vbl) versus time.
Figure 20:
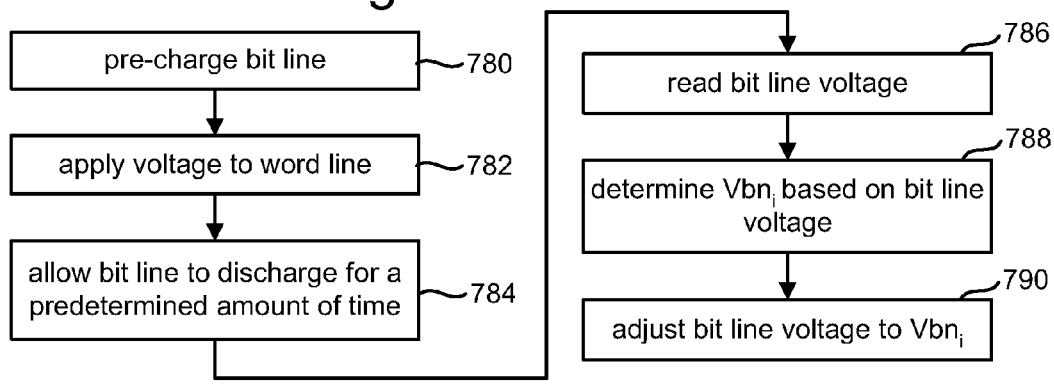
FIG. 20 is a flow chart describing one embodiment of a process for detecting behavior of one or more memory cells and adjusting programming based on the detected behavior.

Another embodiment for detecting behavior and adjusting programming is provided with respect to FIGS. 19 and 20.

The embodiment of FIGS. 19 and 20 seeks to analyze each cell independently and provide a customized bit line voltage for each cell. After one or more initial program pulses, the distribution will be as shown in FIG. 12. Sensing can still be done by applying V_ck to the word line. However, instead of returning a binary "1" or "0" for slow and fast bits, the process will return analog value at a given sense time. Each bit can then have a different bit voltage depending on the threshold voltage of the memory cell. For example, a more strongly erased memory cell will discharge a pre-charged bit line voltage faster and have a smaller bit line voltage, while a more strongly programmed memory cell will not discharge or discharge less. Sensing this discharged bit line voltage level provides a direct measure of how fast or how slowly the memory cell is being programmed. Based on the sensed bit line voltage during a read operation, a new voltage can be determined to be applied to the bit line during the following program steps.

For example, FIG. 19 graphs bit line voltage Vbl versus time during a verify/read operation after the initial set of program pulses. The verify/read process will include pre-charging the bit line and then applying V_ck to the word line. The bit line will then be allowed to discharge for a period of time $t_0$. At time $t_0$, the voltage of the bit line will be read and used to determine a voltage to be applied to the bit line during the following program steps. FIG. 19 shows six curves which represent six different cells programming at six different speeds, with curve 760 representing the slowest programming cell and curve 762 representing the fastest cell.

FIG. 20 is a flow chart describing a process for detecting speed and adjusting the bit line accordingly using the analog voltage sensed on the bit line. The process of FIG. 20 is performed at time 552 of FIG. 11. In step 780, the bit line is pre-charged. In step 782, a voltage is applied to the word line for the cell(s). For example V_ck can be applied to the word line. In step 784, the bit line is allowed to discharge for a predetermined amount of time (e.g. until $t_0$). In step 786, the bit line is read to determine the analog voltage value. In step 788, Vbn (the signal applied to the bit line during program) will be determined based on the bit line voltage read in step 786. In one embodiment, Vbn will be equal to the bit line voltage read in step 786. In another embodiment, Vbn will be a function of the voltage read in step 786. Vbn can be calculated based on an equation formulated by characterizing the device or simulating the device. In step 790, the bit line is adjusted based on the determined value for Vbn.

This concept of characterizing a memory cell based on who it discharges on the bit line can be applied in conjunction with other embodiments disclosed herein. For example, in the embodiment that categorizes the memory cells into multiple groups, the categorization can be based on the concepts described above of discharging the bit line.

Another embodiment for detecting behavior and adjusting programming is provided with respect to FIGS. 21-24. In the embodiment of FIGS. 21-24, the memory cells are programmed as usual until a first memory cell (or other small set) reaches the target threshold voltage range. At that point, all of the other memory cells that have not reached the target threshold voltage range are characterized into fast programming calls or slow programming cells. Those cells that are considered fast programming calls will have their the bit line voltage raised. Those cells that are considered slow programming cells will not have their bit line voltage raised. In this embodiment, all cells will have the same program voltage signal at the word line increased so that programming of the slow cells will be sped up.

Figure 21:
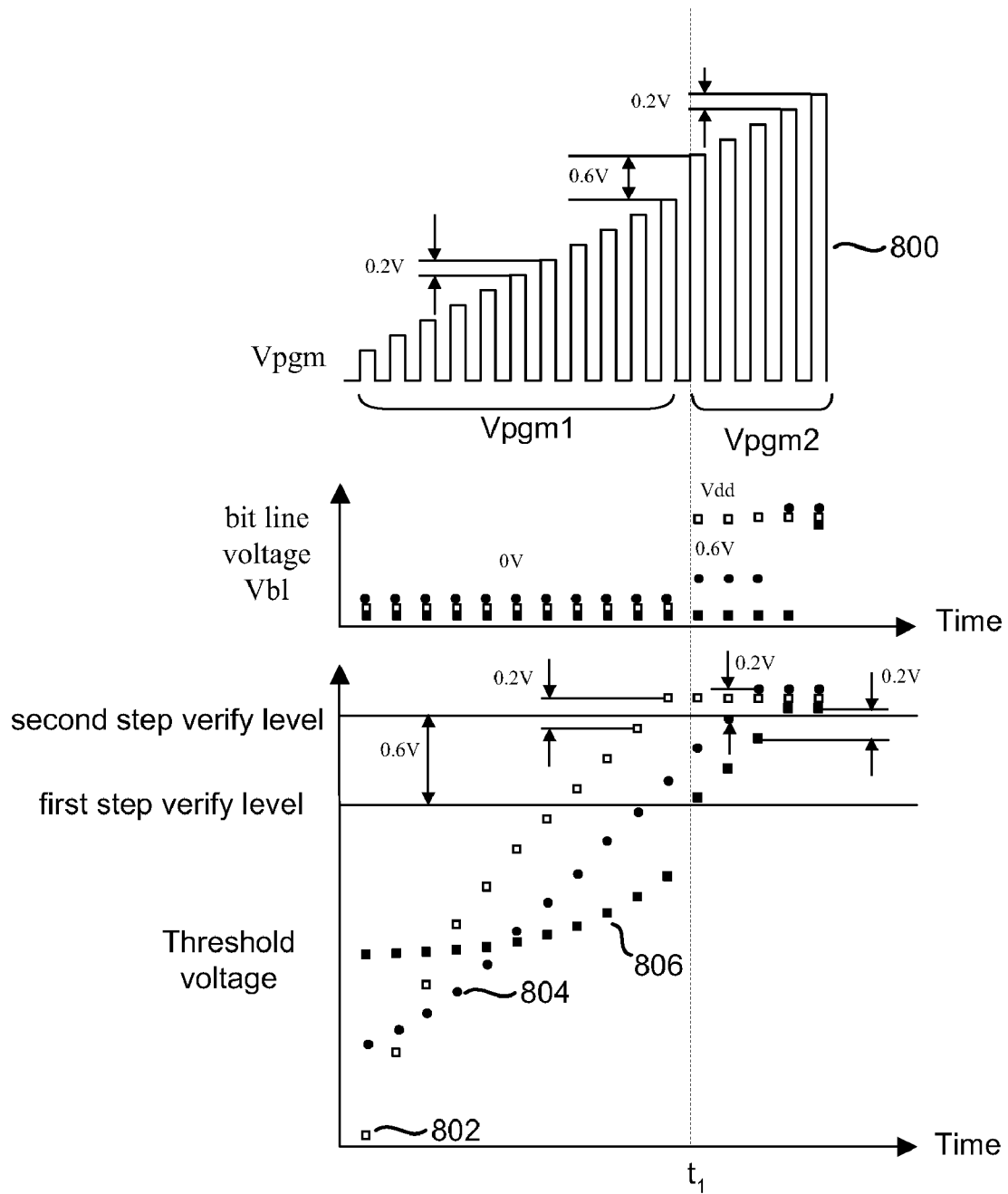
FIG. 21 depicts another embodiment of a process for detecting behavior of one or more memory cells and adjusting programming based on the detected behavior.

FIG. 21 depicts three graphs combined into one figure to explain simultaneous behavior. For example, FIG. 21 shows the program voltage signal Vpgm 800, which is applied to the control gates of the memory cells. This program voltage signal 800 includes a series of that increase in magnitude over time. Signal 800 is broken up into two sets of pulses: Vpgm1 and Vpgm2. Within the set of pulses Vpgm1, the magnitude increases from the previous pulse by 0.2 V. The difference in magnitude between the magnitude of the last pulse in Vpgm1 and the magnitude of the first pulse in Vpgm2 is 0.6 V. Within the pulses in the set Vpgm2, the magnitude of the pulses differ from previous pulses by 0.2 V. All of the flash memory cells will continue receiving pulses from Vpgm1 until one of the cells reaches the target threshold range. At that point, the voltage at the control gate will be stepped up 0.6 volts and the pulses will continue as in Vpgm2.

Below the program voltage signal 800 is a graph depicting bit line voltage Vbl versus time. Below the graph of bit line voltage Vbl versus time is a graph of threshold voltage versus time. The graph of threshold voltage versus time depicts three curves—802, 804 and 806. These three curves pertain to data of the threshold voltage at various times for three memory cells. The memory cell associated with curve 802 is a faster programming memory cell. The memory cell associated with curve 806 is a slower programming memory cell. The memory cell associated with curve 804 is a memory cell that programs slower than the memory cell of curve 802 and faster than the memory cell of curve 806. Note that curve 802 is depicted using empty squares, curve 804 is depicted using filled circles, and curve 806 is depicted using filled squares. Curves 802, 804 and 806 show how the threshold voltage of the three memory cells varies over time in response to program voltage signal 800. With each new pulse from program voltage signal 800, the threshold voltage of the three memory cells increases.

During Vpgm1, each memory cell has its threshold voltage compared to the target voltage, which is indicated in the graph as "second step verify level." When the first memory cell reaches the second step verify level, then Vpgm1 ends. For example FIG. 21 shows the memory cell associated with curve 802 reaching its target second step verify level right before time $t_1$. Thus, at time $t_1$, the program voltage signal is stepped up 0.6 V. Additionally, each of the memory cells that have not reached the second step verify level are tested to determine whether they are fast programming memory cells or slower programming memory cells. In one embodiment, the memory cells are tested in a manner similar to how the memory cells of FIG. 12 are tested against V_ck. In one implementation, the threshold voltage of those memory cells tested are compared to what is depicted in FIG. 21 as the "first step verify level," which, in one embodiment, is 0.6 V less than the second step verify level. Each memory cell with a threshold voltage below the first step verify level is considered a slower programming memory cell. Each memory cell with a threshold voltage at or greater than the first step verify level is considered a faster programming memory cell. Alternatively, a different first step verify level can be determined based on device characterization, other experimentation and/or simulation.

At time $t_1$, the memory cell (or cells) that have reached the target threshold voltage range (e.g., verified against second step verify level) have their bit line voltage raised to Vdd. These can be seen in the graph of bit line voltage Vbl versus time where the curve with empty squares (associated with curve 802) shows the bit line voltage being raised to Vdd. Of those cells that did not reach their target threshold voltage and are tested to be faster programming memory cells, their bit line voltage is raised to an intermediate voltage (e.g., Vbn). For example, the graph of bit line voltage Vbl versus time shows the memory cell associated with the curve 804 (having filled circles), having its bit line voltage raised to 0.6 volts. Those memory cells that test to be slower programming memory cells have their bit line voltage remaining at 0 volts (or another value), as depicted by the curve of square boxes, corresponding to curve 806. The programming will then continue with the Vpgm2. As any memory cell reaches the second step verify level, its bit line will be raised to Vdd.

Figure 22:
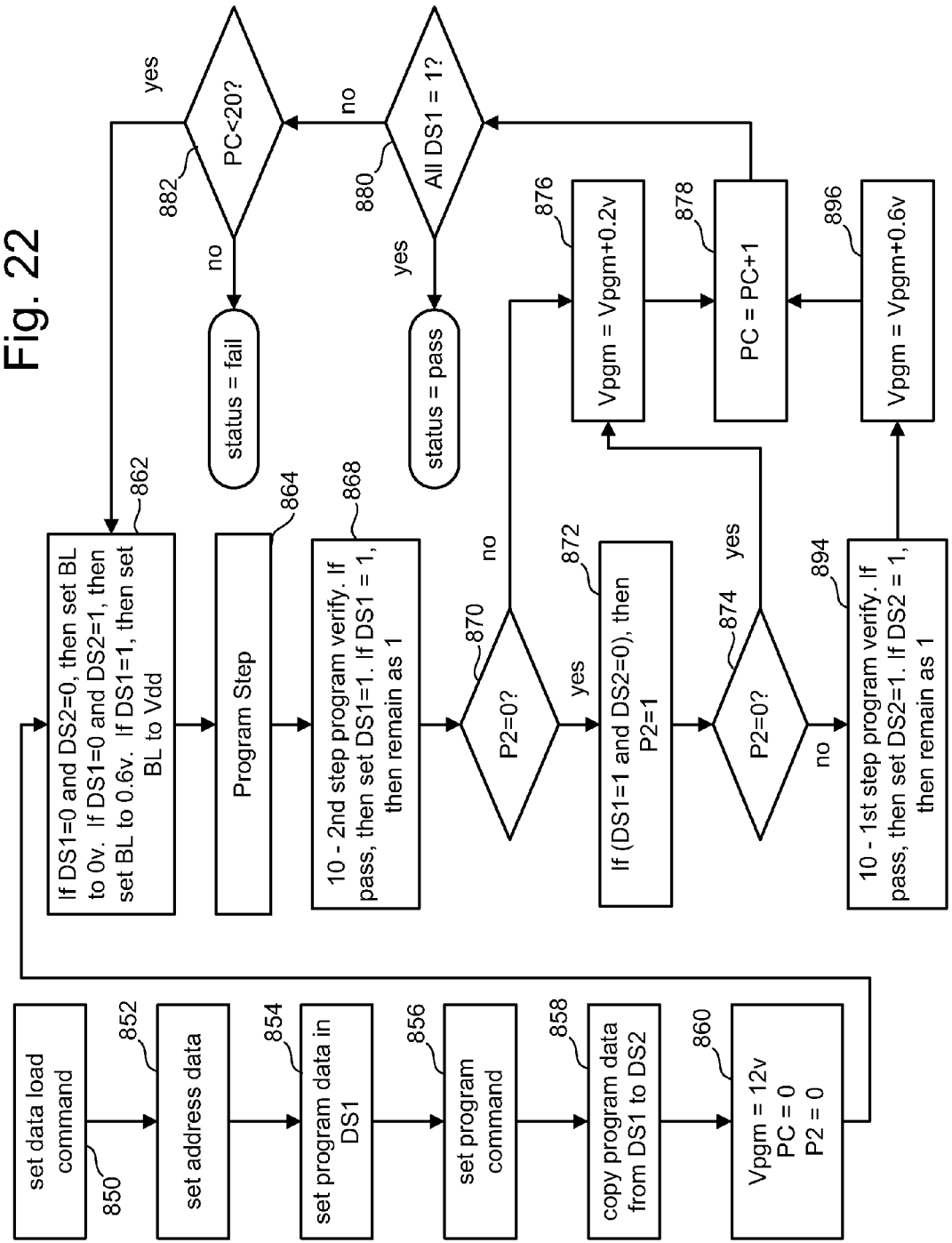
FIGS. 22 and 23 are flow charts describing an example of a programming process that can be used for the embodiments of FIG. 21.

FIG. 22 is a flowchart describing the control algorithm of one embodiment of a flash memory system when writing a lower logical page data into a memory cell. The specific method of FIG. 22 is adapted for the two-step programming methodology described above with respect to FIG. 9, where the memory cell stores data for two logical pages (lower page and upper page), distribution 460 represents 11 state, distribution 462 represents 10 state, distribution 464 represents 00 state, and distribution 466 represents 01 state. Other embodiments with more bits, more pages, different state assignments, etc., are also within the scope of the present invention. Various modifications to the process of FIG. 22 can be made to accommodate other variations on the threshold state assignments and program methodology. Furthermore, the concept of FIG. 21 can be implemented in systems that do not use the two-step programming methodology.

In step 850, the control operation starts with receiving a data input command from the host and placing that data input command in the state machine. In step 852, the operation proceeds to receive address data from the host and place that address data in the state machine in order to select the page to be used for the write operation. In step 854, the operation proceeds to receive data to be written to the appropriate page and stores that data in DS1. In step 856, the operation proceeds to receive a write command issued from the host and places the write command in the state machine. In one embodiment, as a write command is placed in the state machine, the operation of the subsequent steps are automatically started by the state machine. In step 858, the data from DS1 is copied to DS2. In step 860, the initial value for the program voltage Vpgm is set (e.g., 12 volts; however, other values can be used). Additionally, the program counter (PC) is set to 0 and the P2 register is also initialized at 0. In one embodiment, the P2 register is in the state machine. In other embodiments, the P2 register can be in the column control circuit or other components of the system.

In step 862, it is determined whether DS1 is equal to 0 and DS2 is equal to 0. If so, then the bit line for the cell is set to 0 volts. If DS1 is set to 0 and DS2 is set to 1, then the bit line is set to 0.6 volts. If DS1 is set to 1, then the bit line is set to VDD in order to inhibit the cell from programming. In step 864, a program step is performed. That is, one pulse from the program voltage signal 800 is applied. In step 868, a second step verify operation is performed for state 10. That is, the programmed cells are verified against the second step verify level, which in most embodiments is the target verification check. If the memory cell passes the second step verification, then DS1 is set to 1. Note that if DS1 was already 1, then it remains as 1. In step 870, it is determined whether the P2 register is set to 0. If the P2 register is set to 0, then in step 872 it is determined whether DS1 is set to 1 and DS2 is set to 0. This is the case when the memory cell passed the second step program verify. If so, then the P2 register is set to 1; otherwise, the register P2 is not changed. In step 874, it is determined whether P2 is still at 0. If it is (this is a case when a memory cell has not reached the second step verification yet), then in step 876 the program voltage signal is raised by 0.2 volts. In step 878, the program counter is increased by 1. In step 880, it is determined whether the DS1 registers for all memory cells being programmed are set to 1. If so, that means that all of the cells are properly programmed, the programming process is complete and the programming process was successful. If all the DS1 registers are not set to 1, then it is determined in step 882 whether the program counter is less than 20. If so, the process continues at step 862. If the program counter is greater than or equal to 20, then the programming process fails.

When a first memory cell passes the second step verify, then that memory cell will set its DS1 register to 1. Therefore, in step 872, the P2 register will be set to 1, thereby (in step 874), causing the process of FIG. 22 to perform step 894. In step 894, the first step program verification for state 10 is performed. If the memory cell passes, then DS2 is set to 1. Step 894 is the test to determine whether the memory cell is a fast programming cell or a slow programming cell. That is, if the threshold voltage of the memory cell is greater than the first step verify level, then the memory cell is a fast programming memory cell. If DS2 is already 1, then it remains as 1. If the first step program verification does not pass, then DS2 is not changed. Subsequent to step 894, the program voltage is raised in step 896 by 0.6 volts. This corresponds to increase in the step size at time $t_1$ in FIG. 21 so that the program voltage signal transitions from Vpgm1 to Vpgm2. In step 878, the program counter is increased by 1. In step 880, it is determined whether all of the memory cells have been properly programmed, as evidenced because all of their DS1 registers are set at 1. If so, the process is complete. Otherwise, it is determined whether the program counter is less than 20. If the program counter is greater than or equal to 20, then the process fails. If the program counter is less than 20, then step 862 is performed. If the memory cell had passed the first step program, then its DS2 register is set to 1 and its bit line is raised to 0.6 volts because it is a faster programming cell. If the cell did not pass the first step program verification process of step 894, then its DS1 register and DS2 register are both still at 0 and its bit line remains at 0 volts or some other low value according to the appropriate implementation.

Figure 23:
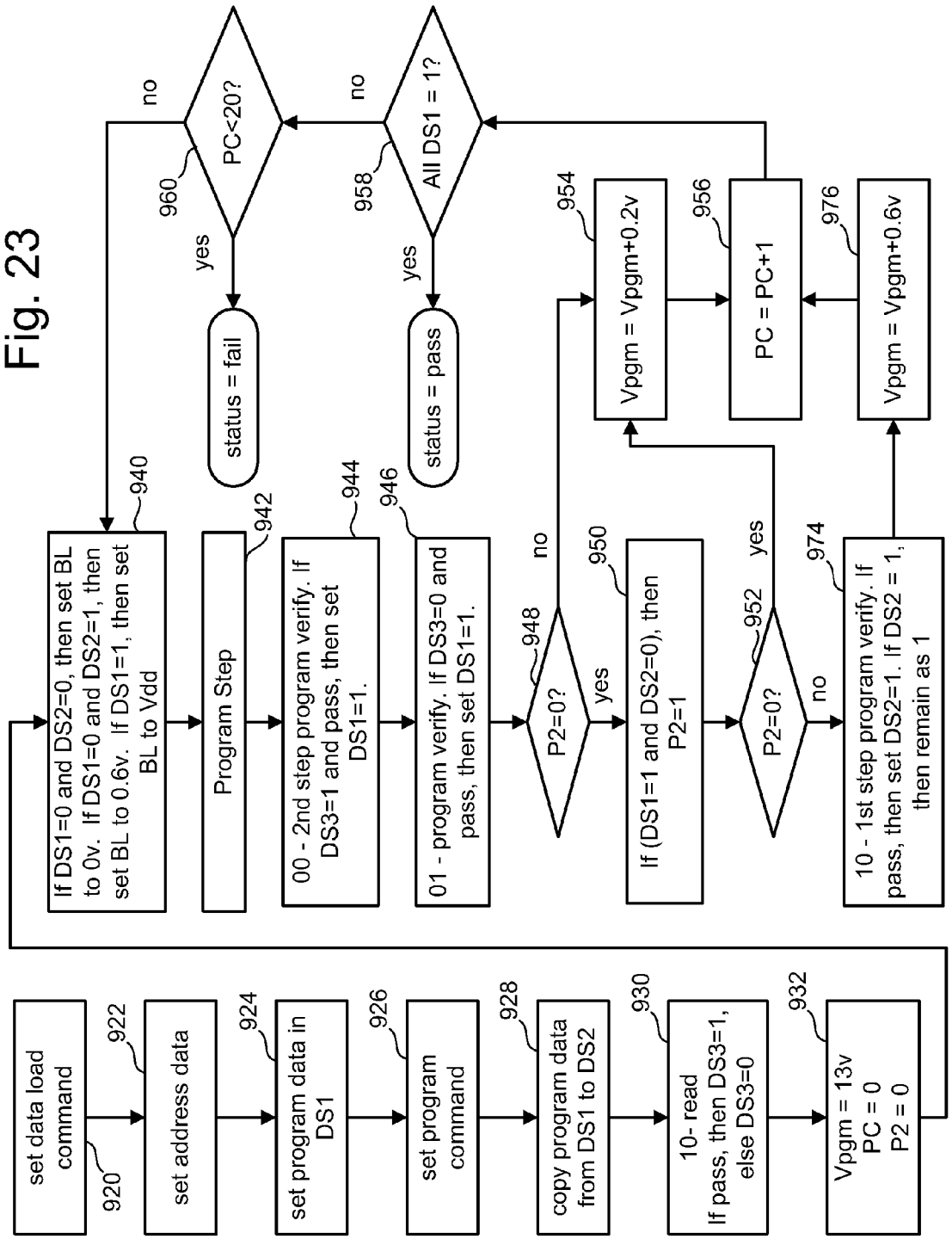

The process of FIG. 22 is for the programming of memory cells from state 11 to state 10. The process of FIG. 23 is for the programming of memory cells from either state 11 to state 01 or from state 10 to state 00. That is, FIG. 22 is a flowchart describing the control algorithm of one embodiment of writing upper page data to the memory cell.

In step 920, the control operation starts with receiving a data input command from the host and placing that data input command in the state machine. In step 922, the operation proceeds to receiving the address data from the host and placing the address in the state machine. In step 924, data to be written is received and stored in DS1. In step 926, a write command is received from the host and placed in the state machine, which (in some embodiments) automatically triggers the start of the subsequent process. In step 928, the program data is copied from DS1 to DS2. In step 930, a state 10 read operation is performed. That is, a read operation is performed using a read compare point that is in between states 11 and 10 to determine whether the memory cell is in state 11 or 10. If it is determined that the memory cell is in state 10, then the DS3 register for that memory cell is set to 1; otherwise, the DS3 register is set to 0. In step 932, the voltage program signal Vpgm is initially set to 13 volts; however, other initial voltages can also be used. Additionally, the program counter is initially set to 0 and the P2 register is initially set to 0.

In step 940, it is determined whether the DS1 register and the DS2 register are both set to 0. If so, then the bit line is also set to 0. If the DS1 register is set to 0 and the DS2 register is set to 1, then the bit line is set to 0.6 volts. If the DS1 register is equal to 1, then the bit line is set to Vdd, which inhibits the memory cell from programming. In step 942, a program step is performed. That is, one pulse is provided to the control gate of the memory cell. In step 944, the state 00 second step verification is performed. That is the threshold voltage of the memory cell is compared to the target verification point for state 00. If the verification process passes and the DS3 register is set to 1, then the DS1 register is also set to 1. In step 946, the state 01 program verification is performed to determine whether the memory cell has reached state 01. If the verification process passes and DS3 is set to 0, then the DS1 register is set to 1. In step 948, it is determined whether P2 register is set to 0. If so, then the process continues in step 950. In step 950, it is determined whether the DS1 register is set to 1 and the DS2 register is set to 0. If so, the P2 register is set to 1. In step 952, it is determined whether the P2 register is set to 0. If so, the process continues at step 954, where the program voltage signal is increased by 0.2 volts (the next step). In step 956, the program counter is increased by 1. In step 958, it is determined whether the DS1 registers for all of the memory cells programmed are set at 1. If so, the program process is complete and successful (status equals pass). If not, then in step 960 it is determined whether the program counter has reached 20. If the program counter has reached 20, then the process fails. If the program counter has not reached 20, then the process continues with step 940.

When the first cell reaches its target threshold voltage range, then the P2 register will be set to 1 in step 950, as explained above. In that case, in step 952, the process will determine that P2 is not equal to 0 and, therefore, the method of FIG. 23 will continue at step 974. In step 974, the first step program verification test for state 10 is performed. That is, the threshold voltage of the memory cell is tested against the first step program verification level for state 10. If the first step program verification process passes, then DS2 is set to 1. If DS2 is already 1, then it remains 1. After step 974, the program voltage is increased by 0.6 volts at step 976. Step 976 is analogous to the increase in step size between Vpgm1 and Vpgm2 at time $t_1$ of FIG. 21. After increasing the step of the program voltage at step 976, the program counter is increased by one in step 956 and the process continues at step 958.

FIG. 24 depicts examples of values for some embodiments associated with FIGS. 21-23. The embodiments of FIGS. 21-24 can also make use of and be used in combination with the concepts described above, including categorizing the memory cells into multiple groups, using the body effect, and discharging the bit line to provide a more customized determination of behavior and/or more customized adjustment of the programming process.

Note that the processes of FIGS. 10, 13, 15, 18, 20, 22 and 23 are likely to be performed by or at the direction of state machine 316 (see FIG. 6). However, in other embodiments, all are part of these processes can be performed by controller 318, other specialized circuitry or other components of the flash memory system. For example, in one implementation, steps 786, 788 and 790 of FIG. 20 are performed by a specialized circuit.

Figure 1:
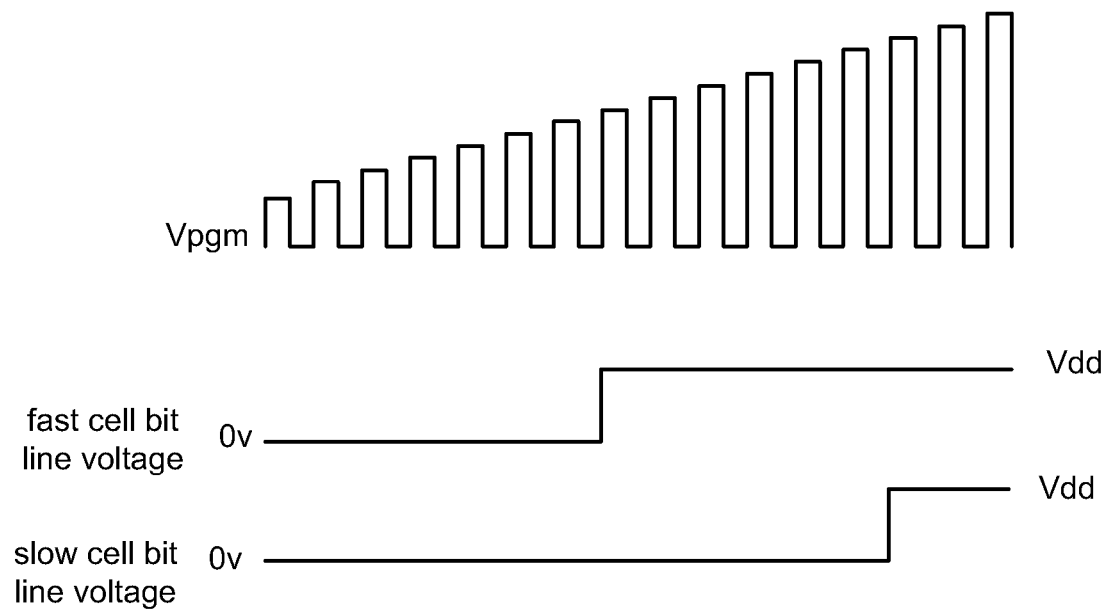
FIG. 1 depicts signals on a word line and bit lines during an exemplar programming process.
Figure 2:
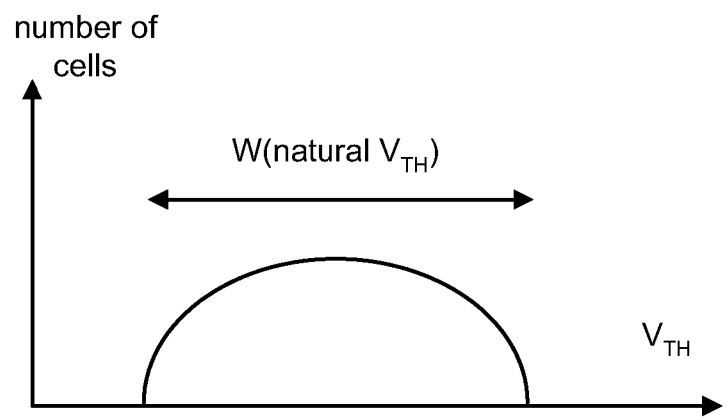
FIG. 2 depicts an example of the natural voltage distribution of a sample of memory cells.

Another possible use of the concept described above is to avoid over programmed bits. That is, the program pulses Vpgm can remain as depicted in FIG. 1; however, the fast programming memory cells will receive the higher bit line voltage to slow them down. This will not decrease program time but can be used to prevent fast programming memory cells from being over programmed. Previous methods to deal with over program bits use more ECC or lower the program voltage. Both more ECC and lowering the program voltage reduce the speed of the programming process. Furthermore, more ECC can require more on-chip hardware.

The above examples are provided with respect to NAND type flash memory. However, the principles of the present invention have application to other types of flash memories and other types of non-volatile memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for programming non-volatile memory, comprising:
    applying at least one programming pulse to control gates of non-volatile storage elements in non-volatile memory while using an initial programming condition, and while a voltage at a first level is applied to a source associated with at least a first of the non-volatile storage elements;
    after applying the at least one programming pulse, raising a threshold voltage of the at least a first of the non-volatile storage elements by raising the voltage which is applied to the source to a second level which is higher than the first level;
    determining whether the at least a first of the non-volatile storage elements with the raised threshold voltage is conductive; and
    while using a first new programming condition for the at least a first of the non-volatile storage elements which is based on a result of the determining, applying a plurality of additional programming pulses to the control gates of the non-volatile storage elements.

2. The method of claim 1, further comprising:
    using the initial programming condition for at least a second of the non-volatile storage elements when applying the plurality of additional programming pulses.

3. The method of claim 1, wherein:
    the first level of the voltage which is applied to the source is 0 V.

4. The method of claim 1, wherein:
    the threshold voltage of the at least a first of the non-volatile storage elements is raised from a negative value to a positive value, and voltages of the at least one programming pulse and the plurality of additional programming pulses are positive.

5. The method of claim 1, wherein:
    the initial programming condition and the first new programming condition comprise different bit line voltages.

6. The method of claim 1, wherein the voltage at the second level raises a threshold voltage of at least a second of the non-volatile storage elements, the method farther comprising:
    determining whether the at least a second of the non-volatile storage elements with the raised threshold voltage is conductive; and when applying the plurality of additional programming pulses, using a second new programming condition for the at least a second of the non-volatile storage elements which is based on a result of the determining whether the at least a second of the non-volatile storage elements with the raised threshold voltage is conductive.

7. The method of claim 6, farther comprising:
using the initial programming condition for at least a third of the non-volatile storage elements when applying the plurality of additional programming pulses.

8. A method for programming non-volatile memory, comprising:
applying a first plurality of programming pulses, using a first step size and an initial bit line voltage, to control gates of non-volatile storage elements in non-volatile memory;
detecting a programming speed of the non-volatile storage elements, including at least a first non-volatile storage element, after applying a last programming pulse of the first plurality of programming pulses; and
while using a first new bit line voltage for the at least a first non-volatile storage element which is based on its detected programming speed, applying a second plurality of programming pulses to the control gates of the non-volatile storage elements, a first programming pulse of the second plurality of programming pulses is stepped up from the last programming pulse of the first plurality of programming pulses by an amount which is greater than the first step size.

9. The method of claim 8, wherein:
the detecting is performed responsive to a determination that a threshold voltage of at least one of the non-volatile storage elements, different than the at least a first non-volatile storage element, has reached a target threshold voltage.

10. The method of claim 8, further comprising:
using the initial bit line voltage for at least a second of the non-volatile storage elements when applying the second plurality of programming pulses.

11. The method of claim 8, wherein:
programming pulses in the second plurality of programming pulses are stepped up using the first step size.

12. The method of claim 8, wherein:
the first programming pulse of the second plurality of programming pulses is stepped up from the last programming pulse of the first plurality of programming pulses by an amount which is based on a natural threshold distribution of the non-volatile storage elements.

13. The method of claim 8, wherein:
the first programming pulse of the second plurality of programming pulses is stepped up from the last programming pulse of the first plurality of programming pulses by an amount which is based on one-half of a width of a natural threshold distribution of the non-volatile storage elements.

14. The method of claim 8, wherein:
the non-volatile storage elements are arranged in NAND strings, and each NAND string is associated with a respective bit line.

15. The method of claim 8, further comprising:
using a second new bit line voltage for at least a second of the non-volatile storage elements which is based on its detected programming speed, when applying the second plurality of programming pulses.

16. The method of claim 15, further comprising:
using the initial bit line voltage for at least a third of the non-volatile storage elements when applying the plurality of additional programming pulses.

17. A method for programming non-volatile memory, comprising:
applying at least one programming pulse to control gates of non-volatile storage elements in non-volatile memory while using an initial programming condition;
detecting a behavior of the non-volatile storage elements, including at least a first non-volatile storage element, after applying the at least one programming pulse; and
while using a first new programming condition for the at least a first non-volatile storage element which is based on its detected behavior, applying a plurality of additional programming pulses to the control gates of the non-volatile storage elements, a first programming pulse of the plurality of additional programming pulses has a lower magnitude than a magnitude of the at least one programming pulse.

18. The method of claim 17, wherein:
the magnitude of the at least one programming pulse is set at a level so that the non-volatile storage elements are programmed enough so that the detecting is able to distinguish different behaviors of the non-volatile storage elements.

19. The method of claim 17, wherein:
the detecting is performed responsive to a determination that a threshold voltage of at least one of the non-volatile storage elements, different than the at least a first non-volatile storage element, has reached a target threshold voltage.

20. The method of claim 17, wherein:
programming pulses in the plurality of additional programming pulses use a step size which is less than a difference between the magnitudes of the first programming pulse and the at least one programming pulse.

21. The method of claim 17, further comprising:
using the initial programming condition for at least a second of the non-volatile storage elements when applying the plurality of additional programming pulses.

22. The method of claim 17, wherein:
the non-volatile storage elements are arranged in NAND strings, each NAND string associated with a respective bit line, and the initial programming condition and the first new programming condition comprise different bit line voltages.

23. The method of claim 17, further comprising:
using a second new programming condition for at least a second of the non-volatile storage elements which is based on its detected behavior when applying the plurality of additional programming pulses.

24. The method of claim 23, further comprising:
using the initial programming condition for at least a third of the non-volatile storage elements when applying the plurality of additional programming pulses.

25. A non-volatile storage system, comprising:
non-volatile storage elements in non-volatile memory; and
one or more control circuits in communication with the non-volatile storage elements, the one or more control circuits, to perform a programming operation: (a) apply at least one programming pulse to control gates of the non-volatile storage elements while using an initial programming condition, and while a voltage at a first level is applied to a source associated with the at least a first of the non-volatile storage elements, (b) after applying the at least one programming pulse, raise a threshold voltage of the at least a first of the non-volatile storage elements by raising the voltage which is applied to the source to a second level which is higher than the first level, (c) determine whether the at least a first of the non-volatile storage elements with the raised threshold voltage is conductive, and (d) while using a first new programming condition for the at least a first of the non-volatile storage elements which is based on a result of the determining, apply a plurality of additional programming pulses to the control gates of the non-volatile storage elements.

26. The non-volatile storage system of claim 25, wherein the one or more control circuits use the initial programming condition for at least a second of the non-volatile storage elements when applying the plurality of additional programming pulses.

27. The non-volatile storage system of claim 25, wherein the first level of the voltage which is applied to the source is 0 V.

28. The non-volatile storage system of claim 25, wherein the threshold voltage of the at least a first of the non-volatile storage elements is raised from a negative value to a positive value, and voltages of the at least one programming pulse and the plurality of additional programming pulses are positive.

29. The non-volatile storage system of claim 25, wherein the non-volatile storage elements are arranged in NAND strings, each NAND string having a respective bit line, and the initial programming condition and the first new programming condition comprise different bit line voltages.

30. The non-volatile storage system of claim 25, wherein the voltage at the second level raises a threshold voltage of at least a second of the non-volatile storage elements, and the one or more control circuits determining whether the at least a second of the non-volatile storage elements with the raised threshold voltage is conductive, and when applying the plurality of additional programming pulses, use a second new programming condition for the at least a second of the non-volatile storage elements which is based on a result of the determining whether the at least a second of the non-volatile storage elements with the raised threshold voltage is conductive.

31. The non-volatile storage system of claim 30, wherein the one or more control circuits use the initial programming condition for at least a third of the non-volatile storage elements when applying the plurality of additional programming pulses.

32. A non-volatile storage system, comprising:
non-volatile storage elements in non-volatile memory; and
one or more control circuits in communication with the non-volatile storage elements, the one or more control circuits, to perform a programming operation: (a) apply a first plurality of programming pulses, using a first step size and an initial programming condition, to control gates of the non-volatile storage elements, (b) detect a behavior of the non-volatile storage elements, including at least a first non-volatile storage element, after applying a last programming pulse of the first plurality of programming pulses, and (c) while using a first new programming condition for the at least a first non-volatile storage element which is based on its detected behavior, apply a second plurality of programming pulses to the control gates of the non-volatile storage elements, a first programming pulse of the second plurality of programming pulses is stepped up from the last programming pulse of the first plurality of programming pulses by an amount which is greater than the first step size.

33. The non-volatile storage system of claim 32, wherein:
the one or more control circuits detect the behavior of the non-volatile storage elements responsive to a determination that a threshold voltage of at least one of the non-volatile storage elements, different than the at least a first non-volatile storage element, has reached a target threshold voltage.

34. The non-volatile storage system of claim 32, wherein the one or more control circuits use the initial programming condition for at least a second of the non-volatile storage elements when applying the second plurality of programming pulses.

35. The non-volatile storage system of claim 32, wherein programming pulses in the second plurality of programming pulses are stepped up using the first step size.

36. The non-volatile storage system of claim 32, wherein the first programming pulse of the second plurality of programming pulses is stepped up from the last programming pulse of the first plurality of programming pulses by an amount which is based on a natural threshold distribution of the non-volatile storage elements.

37. The non-volatile storage system of claim 32, wherein the first programming pulse of the second plurality of programming pulses is stepped up from the last programming pulse of the first plurality of programming pulses by an amount which is based on one-half of a width of a natural threshold distribution of the non-volatile storage elements.

38. The non-volatile storage system of claim 32, wherein the non-volatile storage elements are arranged in NAND strings, each NAND string having a respective bit line, and the initial programming condition and the first new programming condition comprise different bit line voltages.

39. The non-volatile storage system of claim 32, wherein the one or more control circuits use a second new programming condition for at least a second of the non-volatile storage elements which is based on its detected behavior, when applying the second plurality of programming pulses.

40. The non-volatile storage system of claim 39, wherein the one or more control circuits use the initial programming condition for at least a third of the non-volatile storage elements when applying the plurality of additional programming pulses.

41. A non-volatile storage system, comprising:
non-volatile storage elements in non-volatile memory; and
one or more control circuits in communication with the non-volatile storage elements, the one or more control circuits, to perform a programming operation: (a) apply at least one programming pulse to control gates of non-volatile storage elements in non-volatile memory while using an initial programming condition, (b) detect a behavior of the non-volatile storage elements, including at least a first non-volatile storage element, after applying the at least one programming pulse, and (c) while using a first new programming condition for the at least a first non-volatile storage element which is based on its detected behavior, apply a plurality of additional programming pulses to the control gates of the non-volatile storage elements, a first programming pulse of the plurality of additional programming pulses has a lower magnitude than a magnitude of the at least one programming pulse.

42. The non-volatile storage system of claim 41, wherein the magnitude of the at least one programming pulse is set at a level so that the non-volatile storage elements are programmed enough so that the detecting is able to distinguish different behaviors of the non-volatile storage elements.

43. The non-volatile storage system of claim 41, wherein:
the one or more control circuits detect the behavior of the non-volatile storage elements responsive to a determination that a threshold voltage of at least one of the non-volatile storage elements, different than the at least a first non-volatile storage element, has reached a target threshold voltage.

44. The non-volatile storage system of claim 41, wherein programming pulses in the plurality of additional programming pulses use a step size which is less than a difference between the magnitudes of the first programming pulse and the at least one programming pulse.

45. The non-volatile storage system of claim 41, wherein the one or more control circuits use the initial programming condition for at least a second of the non-volatile storage elements when applying the plurality of additional programming pulses.

46. The non-volatile storage system of claim 41, wherein the non-volatile storage elements are arranged in NAND strings, each NAND string having a respective bit line, and the initial programming condition and the first new programming condition comprise different bit line voltages.

47. The non-volatile storage system of claim 41, wherein the one or more control circuits use a second new programming condition for at least a second of the non-volatile storage elements which is based on its detected behavior when applying the plurality of additional programming pulses.

48. The non-volatile storage system of claim 41, wherein the one or more control circuits use the initial programming condition for at least a third of the non-volatile storage elements when applying the plurality of additional programming pulses.

* * * * *